(12) United States Patent
Koike et al.

(10) Patent No.: US 7,084,421 B2
(45) Date of Patent: Aug. 1, 2006

(54) LIGHT-EMITTING DEVICE USING GROUP III NITRIDE GROUP COMPOUND SEMICONDUCTOR

(75) Inventors: Masayoshi Koike, Aichi (JP); Shiro Yamazaki, Aichi (JP); Akira Kojima, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 249 days.

(21) Appl. No.: 09/725,496

(22) Filed: Nov. 30, 2000

(65) Prior Publication Data

US 2001/0002048 A1 May 31, 2001

(30) Foreign Application Priority Data

Nov. 30, 1999 (JP) .................................... H11-341357

(51) Int. Cl.
*H01L 29/06* (2006.01)

(52) U.S. Cl. ............................. 257/14; 257/94; 257/103

(58) Field of Classification Search ................... 257/14, 257/13, 103, 94, 96, 97
See application file for complete search history.

(56) References Cited

U.S. PATENT DOCUMENTS

| | | | | |
|---|---|---|---|---|
| 4,862,471 A | * | 8/1989 | Pankove | 372/45 |
| 5,945,689 A | | 8/1999 | Koike et al. | |
| 6,046,464 A | * | 4/2000 | Schetzina | 257/96 |
| 6,100,546 A | * | 8/2000 | Major et al. | 257/103 |
| 6,441,393 B1 | * | 8/2002 | Goetz et al. | 257/13 |

* cited by examiner

*Primary Examiner*—Sara Crane
(74) *Attorney, Agent, or Firm*—McGinn & Gibb, PLLC

(57) ABSTRACT

A light-emitting semiconductor device provides an active layer which comprises thirteen (13) layers that includes six (6) pairs of quantum barrier layers made of $Al_{0.95}In_{0.05}N$ and quantum well layers made of $Al_{0.70}In_{0.30}N$, which are laminated together alternately. The semiconductor device may also comprise a quantum well layer having a high composition ratio of indium (In). Forming the quantum barrier layer and the quantum well layer to have a high composition ratio of indium (In) increases the lattice constant of the active layer of the semiconductor device.

26 Claims, 8 Drawing Sheets

| QUANTUM WELL LAYER | QWn: | $0 < x_n \leq 1$ | $\cdots n = 1, 2$ |

QUANTUM BARRIER LAYER  QBm  $\begin{cases} 0 \leq y_m \leq 1 \\ 0 \leq z_m < 1 \\ 0 \leq z_m + y_m \leq 1 \end{cases}$  m=1, 2, 3

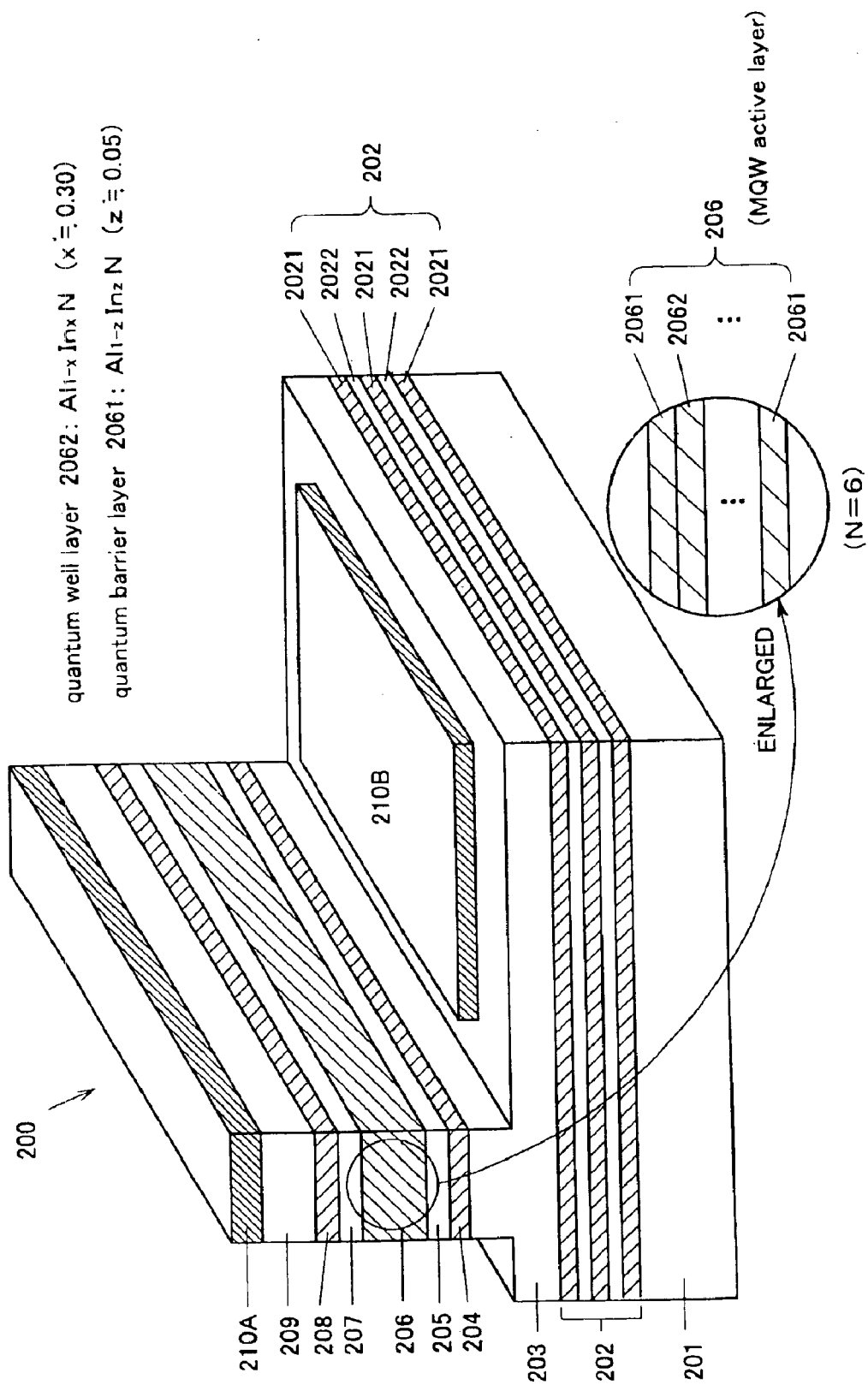

qwn: quantum well layer (n=1, 2)

qbm: quantum barrier layer (m=1, 2, 3)

LIGHT-EMITTING DEVICE USING GROUP III NITRIDE GROUP COMPOUND SEMICONDUCTOR

BACKGROUND OF THE INVENTION

1. Field of the Invention

The present invention relates to a light-emitting semiconductor device having a substrate, on which multiple semiconductor layers made of group III nitride group compound semiconductor may be laminated.

2. Description of the Related Art

FIG. 8 illustrates a sectional view of a conventional semiconductor layer 900 made of group III nitride group compound. As shown in FIG. 8, the semiconductor layer 900 has a multiple quantum well structure.

In a conventional light-emitting device using group III nitride group compound semiconductor, e.g., LD and LED, quantum well layers qwn (n=1, 2) formed in the multiple quantum well 900 are made of gallium indium nitride ($Ga_{1-xb}In_{xb}N$; 0.10<xb<0.25) and quantum barrier layers qbm (m=1, 2, 3) are made of gallium nitride (GaN).

Especially, in order to form a blue-light-emitting quantum well layer, composition ratio x of indium is preferably around 0.15.

Upper limits of n and m are arbitrary. When the upper limit of n is 1, the light-emitting device using group III nitride group compound semiconductor, e.g., LD and LED, has a single quantum well (SQW) structure.

However, the following problems persist in the conventional light-emitting semiconductor device.

Problem 1: While a quantum well layer qwn is growing, spatial deviation (spatial deviation of existence density) of InN compositions in a quantum well layer tends to occur. Because of this non-uniformity of compositions, light which has colors of high purity and narrow half-width in an emission spectrum cannot be obtained.

Problem 2: By cooling after crystal growth of the semiconductor layer, heat-shrinkage may occur in the light-emitting device that causes warpage and stress to remain in the device. Because a conventional light-emitting device (an active layer) may be affected by residual stress, the device cannot sufficiently control the driving voltage (oscillation threshold). Additionally, because of such stress and high driving voltage, the performance life of the device decreases.

Problem 3: Especially, when a quantum well layer having a thickness less than 50 nm is laminated in a light-emitting device (an active layer), the quantum well layer, which is relatively thin, may become easily affected by the internal stress. As a result, especially when such a thin quantum well layer is laminated in the light-emitting device (an active layer), internal stress tends to become a significant problem.

SUMMARY OF THE INVENTION

Accordingly, in light of the above problems, an object of the present invention is to improve purity of the luminous color, lengthen the performance life of the device, and lower the driving voltage (oscillation threshold).

In order to solve the above problems, an aspect of the present invention is to form an $Al_{1-x}In_xN$ (0<x≦1) quantum well layer in a light-emitting semiconductor device, which comprises a substrate and multiple semiconductor layers made of group III nitride group compound semiconductor.

Another aspect of the present invention is a light-emitting device having a multiple quantum well structure, in which a quantum well layer made of $Al_{1-x}In_xN$ (0≦x≦1) and a quantum barrier layer made of $Al_{1-z-y}Ga_yIn_zN$ (0≦y≦1, 0≦z≦1, 0≦z+y≦1) are laminated together alternately.

An additional aspect of the present invention is that a composition ratio x of indium (In), which satisfies the above formula, may be in a range of 0.1≦x≦1.

A further aspect of the present invention is that a composition ratio y of gallium (Ga), which satisfies the above formula, may be y=1, y≈1, or 0.9<y≦1.

Another aspect of the present invention is that the composition ratio x of indium (In), the composition ratio y of gallium (Ga), and a composition ratio z of indium (In), which satisfies the above formula, may be y=0 and 0≦z<x≦1, and 0≦z<x≦1, or 0≦y<0.1 and 0≦z<x<1.

An additional aspect of the present invention is that the composition ratio z of indium (In), which satisfies the above formula, may be z=0, z≈0, or 0≦z<0.1.

A further aspect of the present invention is that the thickness of the quantum well layer may be in a range from 1 nm to 10 nm.

Another aspect of the present invention is to form the quantum well layer comprising three to ten layers.

An additional of the present invention is that the thickness of the quantum barrier layer may be in a range from 3 nm to 10 nm.

Another aspect of the present invention is to substitute a portion of the nitrogen (N) in the quantum well layer or the quantum barrier layer for group V dopants by doping group V impurities such as phosphor (P), arsenic (As), antimony (Sb), and bismuth (Bi).

A further aspect of the present invention is to substitute a portion of the group III elements (Al, Ga, and In) in the quantum well layer or the quantum barrier layer for other group III dopants by doping group III impurities such as boron (B) and thallium (Ti).

An additional aspect of the present invention is that the composition ratio x of indium (In), which satisfies the above formula, may be 0.15≦x≦0.6.

Another aspect of the present invention is that the composition ratio x of indium (In), which satisfies the above formula, may be 0.15≦x≦0.5.

An additional aspect of the present invention is that the thickness of the quantum well layer may be in a range from 2 nm to 6 nm.

FIG. 1 is a sectional view of a group III nitride group compound semiconductor layer having a multiple quantum well (MQW) structure according the present invention.

A light-emitting device using group III nitride group compound semiconductor (an LD or an LED) in the present invention may comprise a quantum well layer QWn (n=1, 2) and a quantum barrier layer QBm (m=1, 2, 3). An aluminum indium nitrogen $Al_{1-xn}In_{xn}N$ (0<xn≦1) and aluminum gallium indium nitrogen $Al_{1-zm-ym}Ga_{ym}In_{zm}N$ (0≦ym<1, 0≦zm<1, 0≦zm+ym≦1) may be used to form the quantum well layer QWn and the quantum barrier layer QBm, respectively.

Alternatively, a binary element InN (xn=1) may be used to form the quantum well layer QWn, and binary elements GaN (ym=1) and AlN (zm+ym=0) can be used to form the quantum barrier layer QBm. Further alternatively, a ternary elements GaInN (zm+ym=1), AlInN (ym=0), and AlGaN (zm=0) may be used to form the quantum barrier layer QBm.

The upper limits (N, M) of n and m may be arbitrary. When the upper limit of n is 1, a light-emitting device using group III nitride group compound semiconductor, such as an LD or an LED, having a single quantum well (SQW) structure may be obtained. Such a light-emitting device does not need to include a quantum barrier layer.

Alternatively, a quantum barrier layer QBM, where M is the number figure of m, which is formed on the uppermost position and a quantum barrier layer QBI which is formed on the lowest position may be laminated by, e.g., thickening the quantum barrier layer, to form a layer which functions as a cladding layer or an optical guide layer.

Alternatively, by adjusting the maximum numbers of M and N to be a higher number, a multiple quantum well (MQW) of super lattice structure may be obtained.

Alternatively, the mixing ratios of the quantum well layers QWn and the quantum barrier layers QBm may be different from each other. For example, the composition ratios x and z may be $z1 \geq z2 \geq z3 \geq \ldots \geq zM$ and $x1 \geq x2 \geq x3 \geq \ldots \geq xN$.

After the above-described processes, the device of the present invention may overcome problems that persist in conventional devices.

In order to grow a group III nitride group compound semiconductor layer including indium (In) by crystal growth, the conditions may be fixed to a predetermined optimum condition to grow the semiconductor layer and so that the In gas supplying amount ρ may be increased. Then, the mixing ratio x of indium (In) in the semiconductor layer (quantum well layer) increases as the In gas supplying amount ρ increases ($\rho_b \rightarrow \rho_a$). As the composition ratio x of indium (In) increases, this reduces the likelihood that the spatial density deviation (segregation) of composition in InN will occur.

Under such conditions, a quantum well layer having a high composition ratio ($x_a$) of indium (In) is difficult to occur due to the non-uniformity of InN composition compared with a quantum well layer having a low composition ratio ($x_b$) of indium (In). Accordingly, forming a quantum well layer having a high composition ratio ($x_a$) of indium (In) is more advantageous.

When a blue-light-emitting quantum well layer is formed by crystal growth, the quantum well layer is preferably made of AlInN rather than GaInN so that the quantum well layer may have a higher composition ratio ($x_a$) of indium (In).

That is, for example, when a blue-light-emitting quantum well layer is formed by crystal growth, the quantum well layer is preferably made of AlInN rather than GaInN as in a conventional device. As a result, above described Problem 1 may be solved.

By forming the quantum well layer having a higher composition ratio ($x_a$) of indium (In), the quantum well layer having a larger lattice constant and a comparatively softness may be obtained.

Accordingly, because of the softness of the quantum well layer, residual thermal stress in the light-emitting semiconductor device can be relaxed effectively compared with a conventional device and the above-described Problem 2 may also be solved.

The above-description relates to a stress relaxation theory according to the present invention, and the following explanation discusses, in part, a stress durability theory according to the invention.

By substituting a GaInN composition, typically used in a conventional device, for an AlInN composition employed in the present device, the comparatively hard metal element aluminum (Al) improves the durability of the quantum well layer and drastically suppresses the adverse effects to the quantum well layer, which may be caused by the internal stress of the device. Then, the luminous intensity of the device may be improved and the oscillation threshold of laser may be lowered, resulting in an increased performance life of the device.

What is more significant to the present invention is not the theory associated with certain aspect of the description, but that sufficient effect may be actually obtained by the means of the present invention, i.e., Problems 1 and 2 may be eliminated by the present invention.

By forming the quantum well layer using $Al_{1-x}In_xN$ ($0<x \leq 1$), it becomes possible to control (regulate) the softness (and/or hardness) of the quantum well layer extensively by using a parameter x. That is, as the composition ratio x of indium (In) increases, the quantum well layer may be formed softer. Because of that, the softness (and/or hardness) of the quantum well layer may be easily and extensively adjusted, and the ability to optimize the hardness and compositions of the quantum well layer may be improved.

The following results may be achieved by the above-described stress relaxation theory.

Although the stress relaxation operation may be applied to a light-emitting device having a single quantum well (SQW) structure, the number of quantum well layers QWn (the maximum figure of n) is preferably a plural number (2 or more). For example, as shown in the multiple quantum well (MQW) structure of FIG. 1, the quantum well layer QW1 may relax the stress which works in the upward direction from the quantum barrier layer QBI side to the quantum well layer QW2 side. Additionally, the quantum well layer QW2 may relax the stress, which works in the downward direction from the quantum barrier layer QB3 side to the quantum well layer QW1 side.

When the device having a multiple quantum well (MQW) structure includes, for example, three quantum well layers, the stresses, which work upwardly and downwardly of the middle quantum well layer may be drastically relaxed by two quantum well layers located above and below the middle quantum well layer.

Accordingly, the larger the number of quantum well layers QWn employed within the device increases the likelihood that the stress relaxation begins to play a more significant role within the device. Although it depends on the thickness of each layer, when the number of quantum well layers QWn is approximately 10, the stress relaxation effect becomes saturated. When too many quantum well layers QWn are laminated together, more time than what is normally needed is required to form a multiple quantum well (MQW) active layer, from a view point of relaxing stress to the active layer (an emission layer).

The stress tends to be generated mainly by the difference of the thermal expansion coefficients of a substrate and group III nitride group compound semiconductor layers, which are laminated on the substrate in sequence. The above described effect may be effectively obtained by increasing the composition ratio or the lattice constant of the indium (In) in a semiconductor layer which is located closer to the substrate—that is, by forming semiconductor layers which becomes softer as they are placed closer to the substrate.

The composition ratios x and z of indium (In) quantum well layers QWx and quantum barrier layers QBz may satisfy $x1 \geq x2 \geq x3 \geq \ldots \geq xN$ and $z1 \geq z2 \geq z3 \geq \ldots \geq zM$. When the quantum well layers QWx and the quantum barrier layers QBz satisfy the above inequalities, they can relax the stresses within the device more effectively compared to quantum well layers QWx and quantum barrier layers QBz, which satisfy $x1<x2<x3<\ldots<xN$ and $z1<z2<z3<\ldots<zM$.

Alternatively, the composition ratios x and z of indium (In) quantum well layers QWx and quantum barrier layers QBz may satisfy $x1 \geq x2 \geq x3 \approx x4 \leq x5 \leq x6$ and $z1 \geq z2 \geq z3 \approx z5 \leq z6 \leq z7$. When the quantum well layers QWx and quantum barrier layers QBz satisfy the above inequalities, the closer the layers are placed to a layer, which generates stress directly to the active layer and is formed at the outside of the active layer, such as a optical guide layer and a cladding layer, the larger the effect of the relaxation stress becomes.

The above-described constructions are useful especially for forming an active layer having a super lattice structure. Alternatively, they are also useful for forming an active layer having a common multiple quantum well (MQW) structure.

Accordingly, composition ratios x and z of indium (In) may be determined absolutely and relatively by a position of each layers or the amount of internal stresses applied to each layers.

The more indium (In) a semiconductor layer includes, the larger the stress relaxation effect becomes. Similarly, the thickness of each quantum well layers and quantum barrier layers may be determined. The larger the thickness of a semiconductor layer including a larger amount of indium (In) becomes, the larger the stress relaxation effect becomes. When the thickness of the semiconductor layer is too large, however, the crystallinity of the layer tends to decrease. Determining the thickness of a semiconductor layer requires a great care.

By adjusting the composition ratio x of the indium (In) to satisfy $0.1 \geq x \geq 1$, a light-emitting semiconductor device which emits rays (electromagnetic wave) having a desired and useful wavelength, which are mainly visible rays and include ultraviolet rays, may be obtained.

When the composition ratio x of the indium (In) in a quantum well layer is greater than that of a conventional quantum well layer, the composition ratio y of the gallium (Ga) in a quantum barrier layer may be adjusted to satisfy $y=1$, $y\approx 0$ or $0 \leq y < 0.1$. As a result, the optimum or a suitable band gap condition, e.g., $0 \leq z < x1$, enables the lattice constant of the quantum barrier layer to adjust to be close to that of the quantum well layer as shown in FIG. 3. Thus, the crystallinity of the active layer (the emission layer) having a multiple quantum well structure may be improved. As shown in FIG. 3, this is because the mixing ratio of the quantum barrier layer with the maximum lattice constant may be obtained under the condition of $y=0$ and when a desired band gap width of the quantum barrier layer is determined.

When the quantum barrier layer has such a mixing ratio, both the composition ratio of indium (In) and the lattice constant of the quantum barrier layer may be increased. As a result, the quantum barrier layer, which is comparatively softer, may be obtained. Accordingly, the quantum barrier layer having such structure may provide the effect of stress relaxation identical to that provided by the quantum well layer.

Indium (In) is a metal material whose production is comparatively small. When the composition ratio y of gallium (Ga) in the quantum barrier layer is $y=1$, $y\approx 1$, or $0.9 < y \leq 1$ or when the composition ratio z of indium (In) in the quantum barrier layer is $z=0$, $z\approx 0$, or $0 \leq z < 0.1$, the amount of indium (In) used to form the quantum barrier layer may be lowered in the light-emitting semiconductor device compared to a conventional light-emitting semiconductor device. By laminating quantum barrier layers which have a smaller composition ratio z of indium (In), an object of the present invention can be satisfied. This is described in following examples (Examples 1 and 3).

By adjusting the thickness of the quantum well layer to be in a range from 1 nm to 10 nm, the quantum well layer may have a suitable or optimum structure. When the quantum well layer is too thick, crystallinity of the semiconductor layer laminated thereon tends to decrease. When the quantum well layer is too thin, sufficient emission of lights cannot be obtained, and the effect of the stress relaxation decreases.

By adjusting the thickness of the quantum barrier layer to be in a range from 3 nm to 10 nm, the quantum barrier layer may have a suitable or optimum structure. When the quantum barrier layer is too thick, the crystallinity of the semiconductor layer laminated thereon tends to decrease and driving voltage (oscillation threshold) increases. When the quantum barrier layer is too thin, this layer does not function sufficiently as a barrier.

Alternatively, the group III nitride group compound semiconductor layer may be made of quaternary compounds including AlGaInN, ternary compounds including AlGaN, GaInN, and AlInN, binary compounds including AlN, GaN, and InN, and compounds which may be doped with group III elements having a larger atomic radius than that of Al or Ga, e.g., In, or doped with group V elements having a larger atomic radius than that of N, e.g., P, As, and Sb. Here, dopants of group III or group V elements are so small that they are not reflected in the composition ratio of the semiconductor layer. Further alternatively, the group III nitride group compound semiconductor layer may be made of AlGaInN compounds, a part of whose composition N may be substituted by, e.g., P, As, and Sb: AlGaInNP, AlGaInNAs, and AlGaInNSb. In short, the group III nitride compound semiconductor layer may be made of any of group III–V compound semiconductor including N.

The reason for doping atoms having larger atomic radius than those of Al, Ga, and N is to improve the crystallinity of the AlGaInN compounds, in which expansion strain may occur, by compensating the crystal with compressive strain. An expansion strain may occur in the AlGaInN compounds as a result of an exclusion of the composition of N. Because acceptor dopants may be easily formed in group III atomic site of such group III nitride compounds, they may be activated as acceptor so that high conductive p-type crystal may be grown.

By adjusting the composition ratio x of the indium (In) to satisfy $0.15 \leq x \leq 0.6$, a light-emitting semiconductor device which emits rays including blue, blue-green, and bluish purple lights having an emission wavelength of visible rays especially recognizable to the naked eye, and a light-emitting semiconductor device which emits rays with a desired wavelength, which is effective in industrial use, may be obtained.

By adjusting the composition ratio x of the indium (In) to satisfy $0.15 \leq x \leq 0.5$, a light-emitting semiconductor device, which emits blue, blue-green, or bluish purple rays may be obtained.

By adjusting the thickness of a quantum well layer to be in a range from 2 nm to 6 nm, the luminous intensity of the device may be improved. For example, when the thickness of each quantum well layers, which are made of AlInN and have a multiple quantum well (6 quantum wells) structure, is approximately 4 nm instead of 8 nm, the luminous intensity of the device increases.

Accordingly, the thickness of the quantum well layer is preferably in a range from 2 nm to 6 nm.

Instead of using AlN, the buffer layer may be made of GaN, InN, $Al_xGa_{1-x}N$ (0<x<1), $In_xGa_{1-x}N$ (0<x<1), $Al_xIn_{1-x}N$ (0<x<1), and $Al_xGa_yIn_{1-x-y}N$ (0<x<1, 0<y<1, 0<x+y<1). The buffer layer may also be made of $Al_xGa_yIn_{1-x-y}N$ (0≦x≦1, 0≦y≦1, 0≦x+y≦1), in which group III elements may be partially substituted by boron (B) or thallium (Tl), and nitrogen atoms may be partially substituted by phosphorus (P), arsenic (As), antimony (Sb), or bismuth (Bi).

Arbitrary group III nitride group compound semiconductor layers including the buffer layer may be doped with n-type dopants including Si or p-type dopants including Mg. Both n-type and p-type dopants may be doped into one layer at a suitable ratio.

Each of the semiconductor layers may be formed to have a super lattice structure and comprise junctions of two or more types of semiconductors.

The buffer layer which may be formed on the substrate may be repeatedly laminated in a group III nitride group compound semiconductor layer grown on the substrate, e.g., a GaN layer which functions as a base layer. This base layer may be referred to as a middle layer, and a layer in which multiple middle layers are laminated may be referred to as a multiple middle layer. These middle layers may have the same compositions as that of the buffer layer. In short, the middle layer may be made of, for example, AlN, GaN, and binary, ternary, or quaternary AlGaInN compounds.

The buffer layer may be formed at a low temperature of 380° C. to 420° C. Also, the buffer layer may be formed at a temperature of 1000° C. to 1180° C. by MOCVD. Preferably, the temperature should be in a range of 1050° C. to 1170° C., and more preferably, 1100° C. to 1150° C. A buffer layer made of AlN having a thickness of 2.3 μm may be formed on a sapphire substrate, at a growth temperature of 1050° C., 1110° C., 1130° C., 1150° C., 1170° C., and 1200° C. A GaN layer having a thickness of 2 μm may be formed on the buffer layer at the same growth temperature, and a surface morphology of the GaN layer as observed by an optical microscope. The surface morphology of the GaN layer is best when the growth temperature of the buffer layer is approximately 1130° C. The surface morphology of the GaN layer experiences an improvement when the growth temperature of the buffer layer is approximately 1110° C. and 1150° C., and the surface morphology experiences a slight improvement, although the best results are not achieved, when the temperature is 1050° C. or 1170° C. However, when the growth temperature of the buffer layer is 1200° C., the surface morphology of the GaN does not achieve the best results. Accordingly, the growth temperature of the buffer layer is preferably in the range of 1000° C. to 1180° C. as described above.

A buffer layer may be formed by MOCVD. Alternatively, MBE can be applied to form a buffer layer. Further alternatively, sputtering may be applied.

A buffer layer made of AlN may be formed by a reactive sputtering in a DC magnetron sputtering equipment, using a high purity metal aluminum (Al) and $N_2$ gas as source materials.

Alternatively, a buffer layer made of $Al_xGa_yIn_{1-x-y}N$ (0≦x≦1, 0≦y≦1, 0≦x+y≦1, where composition ratios x and y are arbitrary figures) using a metal aluminum (Al), a metal gallium (Ga), a metal indium (In), $N_2$ or $NH_3$ gas may be formed. As a method for forming the buffer layer, evaporating, ion plating, laser abration, and ECR can be applied to sputtering. These physical vapor deposit should be preferably carried out at a temperature of 200° C. to 600° C., more preferably 300° C. to 500° C., and further more preferably 400° C. to 500° C.

When using these physical vapor deposition, the thickness of the buffer layer should be preferably in a range of 100 Å to 3000 Å. The thickness should be more preferably in a range of 100 Å to 2000 Å, and the most preferably 100 Å to 300 Å.

After the buffer layer is treated by a heat treatment in the atmosphere of $H_2$ and $NH_3$ gases for 5 minutes, a RHEED pattern may be measured. As a result, the crystallization of the buffer layer treated by a heat treatment may be improved compared with that of the buffer layer which is not treated by a heat treatment.

The flow rate of $H_2$ gas and $NH_3$ gas used in the heat treatment should be preferably 1:0.1 to 1:1. The flow rate should be more preferably 1:0.1 to 1:0.5. A heating temperature should be preferably in a range of 1000° C. to 1250° C., more preferably 1050° C. to 1200° C., and the most preferably 1100° C. to 1150° C. Varying these heating condition or the flow rate of gases, a RHEED pattern of the buffer layer may be measured. As a result, the crystallization of the buffer layer improves when the flow rate of the gases and the heating temperature are in the range shown above. According to the result, a single crystallization may be improved by a recrystallization of the buffer layer.

A GaN layer having a thickness of 41 μm may be formed on the buffer layer by MOCVD, and then a rocking curve of the GaN layer may be measured by an X-ray diffraction equipment. As a result, a single crystallization of GaN formed on the buffer layer, which is treated by the heat treatment as described above, may improve even more compared with that of the GaN formed on a buffer layer which is formed on a substrate by using MOCVD.

Because the buffer layer may be formed by a physical vapor deposit and heat treated at a high temperature, a single crystallization of the buffer layer may be promoted. As a result, the single crystallization of the GaN layer may be improved.

A substrate may be made of sapphire, spinel ($MgAl_2O_2$), silicon (Si), carbon silicide (SiC), zinc oxide (ZnO), gallium phosphide (GaP), gallium arsenide (GaAs), magnesium oxide (MgO), manganese oxide, lithium gallium oxide ($LiGaO_2$), molybdenum sulfide (MoS), etc.

When a well layer and a barrier layer grow at a temperature of 600° C. to 900° C. and a difference between growth temperatures of the barrier and the well layers is $\Delta T \leq 50°$ C., the crystallization of an emission layer or an active layer may improve. Here, the growth temperature of the barrier layer is higher than that of the well layer.

As a protective film, silicon oxide, titanium oxide, aluminum oxide, silicon nitride, etc. may be employed.

As an epitaxial lateral overgrowth (ELO) method, a method without using a protective (preventing crystal growth) film and a method using a protective film may be included. In the former ELO method, a layer such as a substrate and a buffer layer may be partially exposed by etching, etc. and a semiconducting crystal grows on the etched layer in lateral direction. In the latter ELO method, a protective film may be formed on a layer such as a substrate and a buffer layer and a semiconducting crystal on the exposed layer in lateral direction.

A protective film used in an ELO method should be made of a material on which a group III nitride group compound semiconductor is difficult to grow. For example, oxide and nitride such as silicon oxide ($SiO_x$), silicon nitride ($Si_xN_y$), titanium oxide ($TiO_x$), and zirconium oxide ($ZrO_x$), a multiple layers film comprising those oxide or nitride, and metals whose fusing point is over 1200° C.

Accordingly, a protective film used in an ELO method may be made of a material, which can endure 600° C. to 1100° C. of the growth temperature of a group III nitride and on which a group III nitride group compound semiconductor never grows on the material or has difficulty growing on the surface of the material. As a method for forming the protective film, evaporating, a gaseous phase epitaxy, and sputtering may be applied.

In sum, the present invention relates to a light-emitting semiconductor device having a substrate, on which multiple semiconductor layers made of group III nitride group compound semiconductor may be laminated. In short, the light-emitting semiconductor device of the present invention may be applied to light-emitting devices using group III nitride group compound semiconductor such as LEDs and laser diodes (LDs).

The present invention may also be applied to a light-emitting device using group III nitride group compound semiconductor comprising a comparatively thinner quantum well layer in an active layer so that the efficiency of the device may be improved.

BRIEF DESCRIPTION OF THE DRAWING

The invention will be more fully understood by reference to the following embodiment, but not limited thereto.

FIG. 4 is a view showing a group III nitride group compound semiconductor laser 200 according to a second embodiment of the present invention;

DETAILED DESCRIPTION OF THE PREFERRED EMBODIMENT

The present invention will now be described by way of exemplary embodiments.

Figure 1:
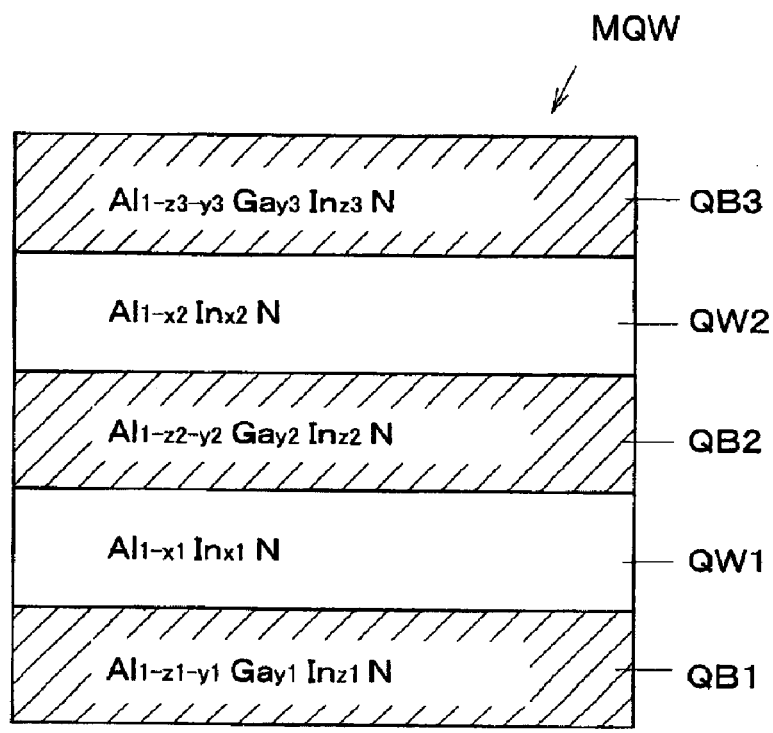
FIG. 1 is a sectional view of a semiconductor layer, which includes a multiple quantum well structure and is made of a group HI nitride group compound, according to the present invention.
Figure 2:
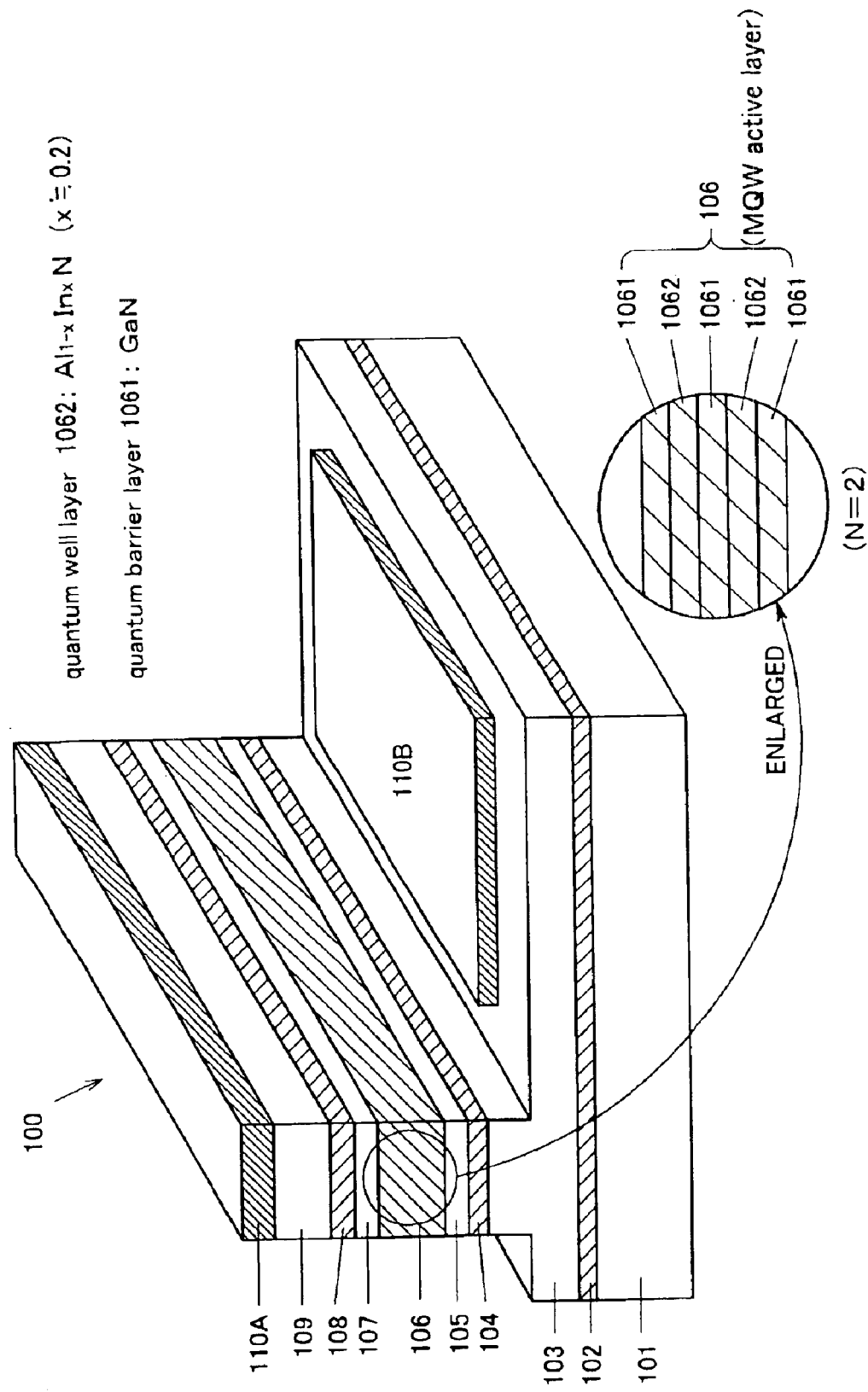
FIG. 2 is a schematic view showing a group III nitride group compound semiconductor laser 100 according to a first embodiment of the present invention.
Figure 3A:
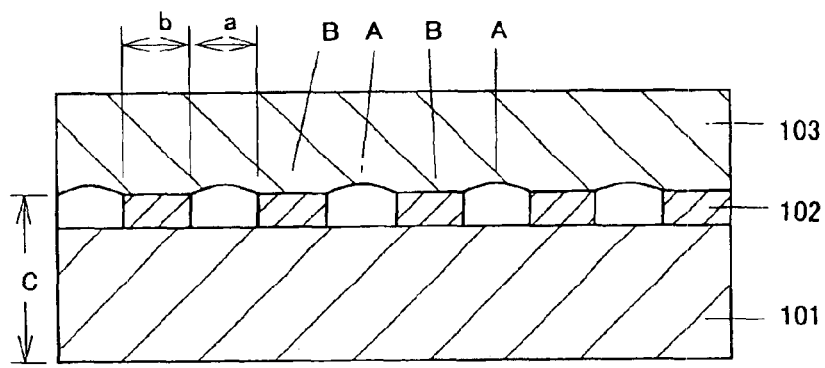
FIGS. 3A–3C are schematic sectional views showing the structure of the group III nitride group compound semiconductor 100 according to the first embodiment of the present invention.
Figure 3B:
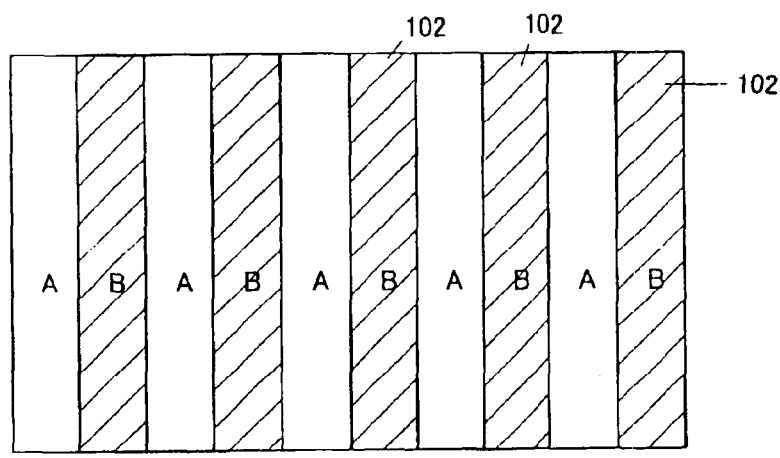
Figure 3C:
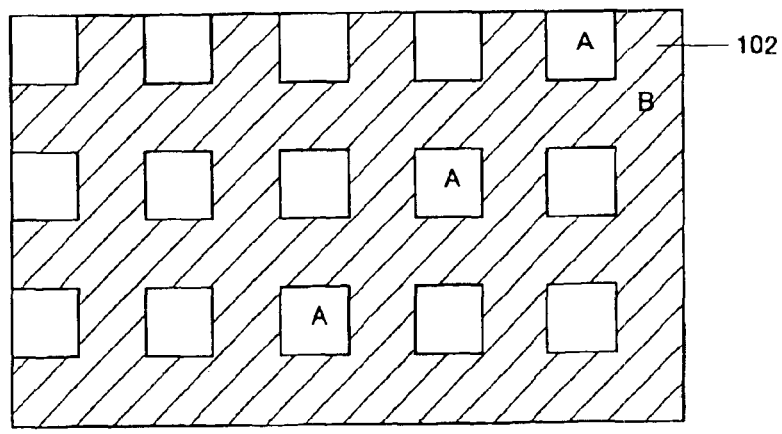

FIG. 2 illustrates a group III nitride group compound semiconductor laser 100 according to an embodiment of the invention. FIGS. 3A–3C depict sectional views of a buffer layer 102 in the group III nitride group compound semiconductor laser 100 of the embodiment of FIG. 2.

A silicon substrate 101 sits at the base of the group III nitride compound semiconductor laser 100, an $Al_{0.15}Ga_{0.85}N$ layer 102 having a thickness of about 1000 Å and having either a striped pattern (FIG. 3B) or a grid pattern (FIG. 3C). In FIG. 3A, a silicon (Si) doped GaN layer 103 may serve an n-type contact layer (an $n^+$ layer of high carrier concentration), having a thickness of about 10 μm and an electron concentration of $2 \times 10^{18}/cm^3$. An upper portion of layer 102 may be removed from the substrate 101 so that the silicon doped GaN layer 103 may reside in regions A and in regions B which are defined above the islands of the layer 102.

The n-type contact layer 103 is hereinafter referred to as an n-layer 103.

A silicon (Si) doped $Al_{0.08}Ga_{0.92}N$ as an n-type cladding layer 104, having a thickness of about 1 μm and an electron concentration of $2 \times 10^{18}/cm^3$, may be formed on the n-layer 103. An n-type optical guide layer 105 having a thickness about 100 nm may be formed on the n-type cladding layer 104. The n-type optical guide layer 105 may be a silicon (Si) doped $A_{0.01}Ga_{0.99}N$ having an electron concentration of $2 \times 10^{18}/cm^3$.

An active layer 106 having a multiple quantum well (MQW) structure may be formed on the n-type optical guide layer 105. The active layer 106 may include three (3) GaN quantum barrier layers 1061 and two (2) $Al_{0.80}In_{0.20}N$ quantum well layers 1062, which are alternately laminated together. The thickness of each of the quantum barrier layers 1061 and the quantum well layers 1062 may be approximately 6 nm and 4 nm, respectively.

A p-type optical guide layer 107 having a thickness about 100 nm may be formed on the active layer 106 having a multiple quantum well (MQW) structure. The p-type optical guide layer 107 may be a magnesium (Mg) doped $A_{0.01}Ga_{0.99}N$ having a whole concentration of $5 \times 10^{17}/cm^3$.

A magnesium (Mg) doped $Al_{0.08}Ga_{0.92}N$ as a p-type cladding layer 108, having a thickness of approximately 1 μm and a hole concentration of $5 \times 10^{-17}/cm^3$, may be formed on the p-type optical guide layer 107. A magnesium (Mg) doped GaN as a p-type contact layer 109, having a thickness about 300 nm and a whole concentration of $5 \times 10^{17}/cm^3$, may be formed on the p-type cladding layer 108. An Ni electrode 110A may be formed on the p-type contact layer 109, and an Al electrode 110B may be formed on the n-layer 103.

An exemplary process for manufacturing the light-emitting device (semiconductor laser) will be explained hereinafter.

The light-emitting device 100 may be formed through the use of a metal organic vapor phase epitaxy (hereinafter referred to as "MOVPE") method. The gases employed in this process may be ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

First, the process employs a susceptor provided in a reaction chamber of an MOVPE apparatus. Then, the process may including positioning an n-silicon substrate 101 having a principal surface of (111), (100), or (110) and cleaned with aqueous hydrofluoric acid ($HF:H_2O=1:1$) onto the susceptor provided in the reaction chamber. Then, the substrate proximately 10 minutes at 1150° C. under normal pressure in a state in which reaction chamber at a flow rate of 2 liters/min.

Subsequently, while reaction chamber maintains the substrate 101 at a temperature of 1150° C., an $Al_{0.15}Ga_{0.85}N$ buffer layer 102 having a thickness of about 1000 Å and an Si concentration of $1.0\times10^{18}/cm^3$ forms by feeding into the reaction chamber gases such as $N_2$ or $H_2$ at 10 liters/min, $NH_3$ at 10 liters/min, TMG at $1.0\times10^4$ mol/min, trimethyl aluminum ($Al(CH_3)_3$) (hereinafter referred to as "TMA") at $1.0\times10^{-5}$ mol/min, and silane, diluted with $H_2$ gas to 0.86 ppm, at $20\times10^{-8}$ mol/min.

Then, an $SiO_2$ layer having a thickness of about 2000 Å forms through performing a sputtering process on the buffer layer 102. A photoresist may be applied onto the $SiO_2$ layer. Then, the $SiO_2$ layer may be etched into a predetermined pattern by means of photolithography. Subsequently, the $A_{0.15}Ga_{0.85}N$ buffer layer 102 may be dry-etched while the $SiO_2$ layer having the predetermined pattern may be as a mask. Then, the mask ($SiO_2$ layer) may be removed.

In this manner, the $Al_{0.15}Ga_{0.15}N$ buffer layer 102 may be formed into a striped pattern (FIG. 5B) or a grid pattern (FIG. 3C) such that each of the regions B defined above the layer 102, as illustrated in FIG. 3A, may have a width (b) of approximately 5 μm and each of the exposed areas of regions A of the substrate 101 may have a width (a) of approximately 5 μm.

Then, an n-type GaN layer 103 having a thickness of 10 μm may be grown epitaxially by employing an MOVPE method, in which the substrate 101 remains approximately at 1100° C., and by feeding gases such as $N_2$ or $H_2$ was fed at 20 liters/min, $NH_3$ at 10 liters/min, TMG at $1.0\times10^4$ mol/min, and silane, diluted with $H_2$ gas to 0.86 ppm, at $20\times10^{-8}$ mol/min into the chamber. In this case, a GaN layer grows epitaxially on the island(s) of the $Al_{0.15}Ga_{0.85}N$ buffer layer 102, serving as nuclei (seeds). However, the GaN layer 103 does not grow epitaxially in the exposed area of regions A of the substrate 101. In each of the exposed regions of regions A of the substrate 101, from the GaN layer grown on the $Al_{0.15}Ga_{.0.85}N$ buffer layer 102, which serves as a nucleus, the GaN grows in a lateral direction (in a direction parallel to the crystal growth surface of the silicon substrate 101).

The n-layer 103 made of GaN may include dislocations along the vertical direction in only the regions B, which define the area above the island(s) of the $Al_{0.15}Ga_{0.85}N$ buffer layer 102. When in the exposed area of the regions A, the n-layer 103 grows epitaxially in a lateral direction. Thus, the n-layer 3 will have no dislocations therein. However, when the exposed area of the region A remains larger than the region B defined above the $Al_{0.15}Ga_{0.85}N$ buffer layer 102, a GaN n-layer 103 of excellent crystallinity may be formed over a wide area.

On top of the n-layer 103, the process forms an n-type cladding layer 104, having approximately 1 μm in thickness of $Al_{0.08}Ga_{0.92}N$ may be formed by concurrently supplying gases such as $N_2$ or $H_2$, $NH_3$, TMA, TMG and silane ($SiH_4$) into the chamber. Next, an n-type optical guide layer 105, having approximately 100 nm in thickness of $Al_{0.01}Ga_{0.99}N$, may be formed on top of the n-type cladding layer 104 by concurrently supplying $N_2$ or $H_2$, $NH_3$, TMA, TMG and silane ($SiH_4$).

Next, by alternately laminating a thin film quantum barrier layer with a thin film quantum well layer together, an active layer 106 having a multiple quantum well (MQW) structure may be formed on the n-type optical guide layer 105.

As shown in the circled portion of FIG. 2, initially the process of generating the MQW includes adding approximately 6 nm in thickness of GaN quantum barrier layer 1061 onto the n-type optical guide layer 105 under conditions by concurrently supplying $N_2$ as a carrier gas, $NH_3$, and TMG. The crystal growth temperature is approximately 600° C. to 900° C., and the quantity of TMG and $NH_3$ gases supplied into the chamber is approximately 2–10 μmol/min. and 11 slm, respectively.

Then, approximately 4 nm in thickness of $A_{0.80}In_{0.20}N$ quantum well layer 1062 may be formed on the quantum barrier layer 1061 by concurrently supplying $N_2$ as a carrier gas, $NH_3$, TMA and TMI. The crystal growth temperature is approximately 600° C. to 900° C., and the quantity of the gases supplied may be approximately 2–10 μmol/min. for TMA and TMI and 11 slm for $NH_3$.

Similarly, another pair of the quantum barrier layer 1061 and the quantum well layer 1062 may be formed in sequence under the same respective conditions, an then approximately 6 nm in thickness of GaN quantum barrier layer 1061 may be formed thereon. Accordingly, the process produces an active layer 106 having a multiple quantum well (MQW) structure, which includes an AlInN quantum well layer 1062.

Next, approximately 100 nm in thickness of $Al_{0.01}Ga_{0.99}N$ may be supplied on the active layer 106 to form a p-type optical guide layer 107 by concurrently supplying $N_2$ or $H_2$, $NH_3$, TMA, TMG and $CP_2Mg$. Then, approximately 1 μm in thickness of $Al_{0.08}Ga_{0.92}N$ may be formed on the p-type optical guide layer 107, as a p-type cladding layer 108, by concurrently supplying $N_2$ or $H_2$, $NH_3$, TMA, TMG and $CP_2Mg$ into the chamber.

A p-type contact layer 109 produced from 300 nm in thickness of Mg-doped GaN may be formed on the p-type cladding layer 108, by controlling the temperature of the sapphire substrate 101 at 1100° C. and concurrently supplying $N_2$ or $H_2$, $NH_3$, TMG and $CP_2Mg$ at a flow rate of 10 L/min., 10 L/min., 100 μmol/min., and 2 μmon/min., respectively.

Then, process employs a reflective electron beam diffraction device to uniformly irradiate electron rays into the p-type contact layer 109, the p-type cladding layer 108 and the p-type optical guide layer 107. The parameters for irradiating the three layers (109, 108, and 107) may be set at approximately 10 kV for the accelerating voltage, at approximately 1 μA for the sample current, at approximately 0.2 mm/s. for the speed of the beam scanning, at approximately 60 μmϕ for the beam aperture, and at approximately 50μ Torr vacuum. This irradiation causes the whole concentrations of the three layers (109, 108, and 107 to increase. For the p-type contact layer 109, the p-type cladding layer 108 and the p-type optical guide layer 107, the respective hole concentrations may be $5\times10^{17}$ $cm^{-3}$, $5\times10^{17}$ $cm^{-3}$ and $5\times10^{17}$ $cm^3$. As a result, the process produces a wafer with a multiple layer structure.

Next, the process may use a sputtering procedure to form a $SiO_2$ layer on the p-type cladding layer 109. Then, a photolithography step may be performed by laminating a photoresist layer on the $SiO_2$ layer. Any residue of the photoresist layer, which forms on the n-layer 103, may be removed, and any residue of the $SiO_2$ layer, which forms on the n-layer 103, may be removed by employing hydrofluroic acid system etching solution.

The portion of the p-type contact layer 109, the p-type cladding layer 108, the p-type optical guide layer 107, the active layer 106, the n-type optical guide layer 105, the n-type cladding layer 104, and the n-layer 103, which is not covered by the photoresist layer and the $SiO_2$ layer, may be dry-etched under conditions set at approximately 0.44 Torr vacuum and at approximately 0.44 W/cm² for a high-frequency power, and by concurrently supplying $Cl_2$ gas and Ar gas. Accordingly, the process forms an electrode ejection part on the n-layer 103.

Nickel (Ni) may be deposited on the p-type contact layer 109 to form an electrode 110A. An aluminum (Al) may be deposited on the n-layer 103 to form an electrode 110B.

In order to form a resonator facet, dry-etching may be performed on the wafer. A scribing groove may be formed by utilizing a scribing process, and pieces of strips of the wafer may be obtained by dicing the wafer in x-axis direction or a direction parallel to the resonator facet. The thus-obtained semiconductor laser 100 exhibits a luminous output of 10 mW and an emission peak wavelength of 380 nm (bluish purple) at 1000 mA of driving current.

Because the semiconductor laser 100 comprises a quantum well layer 1062 having a high composition ratio of indium (In), a non-uniformity of InN composition hardly occurs in the quantum well layer. As a result, the process generates a semiconductor laser having an optimum structure.

By forming a quantum well layer 1062 having a high composition ratio of In, the quantum well layer possesses a larger lattice constant and a softness in comparison to conventional devices. As a result, the driving voltage (oscillation threshold) may be sufficiently controlled, and a semiconductor laser having an improved structure and an increased performance life may be manufactured by relaxing and/or controlling the thermal stress or high voltage.

Consequently, a light-emitting semiconductor device (LD), having an enhanced performance life and a decreased driving voltage (oscillation threshold), may be manufactured by the above-described method.

In this embodiment, the regions A where the silicon substrate 101 may be exposed and which may be formed in a striped or grid pattern may have a width of about 5 μm. The preferred range for the width (a) is approximately 1 μm to 10 μm, because when the width (a) of the regions A becomes larger than 10 μm, the lateral growth requires additional time. When the width (a) of the regions A becomes smaller than 1 μm, forming the GaN layer to have a wide area and high quality becomes more difficult. Additionally, although the width (b) of the regions B defined above the $Al_{0.15}Ga_{0.85}N$ buffer layer 102 may be set to 5 μm, the preferred range for the width b is approximately 1 μm to 10 μm. When the width (b) of the regions B becomes larger than 10 μm, the probability of generating dislocations increases, and when the width (b) becomes smaller than 1 μm, the proper nucleation for the lateral growth becomes difficult to achieve. Further, from the viewpoint of the crystallinity of the n-layer 103, the ratio of (a)/(b), the width a of the region A where the silicon substrate 101 is exposed to the width b of the region B which is defined above the $Al_{0.15}Ga_{0.85}N$ buffer layer 102, preferably falls within the range of 1 to 10.

By forming the area of the region A where the silicon substrate 101 is exposed larger than that of the region B above the $Al_{0.15}Ga_{0.85}N$ buffer layer 102, the n-layer 103 produces an excellent crystallinity over a wide area. In addition, since there are no chemical junctions between the silicon substrate 101 and the n-layer 103 made of GaN thereabove, warpage and stress-induced distortion in the n-layer 103 may be significantly reduced.

Although this exemplary embodiment employs a silicon substrate, other conductive substrate, such as a sapphire substrate or a silicon carbide substrate, may be employed. When the process employs a conductive substrate, the current may be directed to flow perpendicularly through the substrate through formation of an electrode on the back face of the substrate and formation of an electrode as an uppermost layer of device layers formed on the substrate. This structure improves the efficiency of the current supplied in the light-emitting diodes, lasers, and similar components.

Although in the present embodiment the buffer layer 102 may be formed of a gallium nitride group compound semiconductor whose composition is $Al_{0.15}Ga_{0.85}N$, other alternatives, which uses a group III nitride group compound semiconductor represented by a general formula $Al_xGa_yIn_{1-x-y}N$ ($0 \leq x \leq 1$, $0 \leq y \leq 1$, $0 \leq x+y \leq 1$) and having an arbitrary composition ratio, may be employed. However, when the process uses a layer formed epitaxially on the silicon substrate 101, it is preferably to use $Al_xGa_{1-x}N$ ($0<x<1$) (including AlN). In addition, as for the n-layer 103, a group III nitride group compound semiconductor represented by a general formula $Al_xGa_yIn_{1-x-y}N$ ($0 \leq x \leq 1$, $0 \leq y \leq 1$, $0 \leq x+y \leq 1$) and having an arbitrary composition ratio may be used. In this case, although the composition ratio of the n-layer 103 may or may not be identical with that of the buffer layer 102, the n-layer 103 may be required to have a composition ratio in order that growing the n-layer 103 epitaxially on the substrate 101 becomes more difficult compared to growing the n-layer 103 on the buffer layer 102.

In this embodiment, the buffer layer 102 may have a thickness of approximately 1000 ÅÅ. When the buffer layer 102 is excessively thick, the possibility of generation of cracks therein increases, and when the buffer layer 102 is excessively thin, the n-layer 103 will not grow from the buffer layer 102, which serves as a nucleus. For this reason, the thickness of the buffer layer 102 is preferably determined within the range of 500 Å to 2000 Å.

FIG. 4 illustrates a second exemplary embodiment of the invention. FIG. 4 shows a group III nitride group compound semiconductor laser 200 of this embodiment. In general, the semiconductor laser 200 may have a structure similar to the semiconductor laser 100 in the first embodiment. The main characteristics of the physical structure (lamination structure) of the semiconductor laser 200 of the second embodiment may be as follows:

(1) A MQW active layer 206
   (1) A quantum well layer 2062 ($Al_{1-x}In_xN$; $x \approx 0.30$, approximately 5 nm in thickness)
   (2) A quantum barrier layer 2061 ($Al_{1-z}In_zN$; $z \approx 0.05$, approximately 5 nm in thickness)

(2) A buffer layer 202
   (3) A mismatching relaxation layer 2021 (AlN, approximately 500 Å in thickness)
   (4) A single crystal layer 2022 (GaN, approximately 0.3 μm in thickness)

The semiconductor laser 200 shown in FIG. 4 comprises a sapphire substrate 201, and a buffer layer 202 may be formed thereon. The buffer layer 202 may include a multiple layer structure comprising five layers, or 2 pairs of approximately 500 Å in thickness of AlN mismatching relaxation layer 2021 and approximately 0.3 μm in thickness of GaN single crystal layer 2022 and a mismatching relaxation layer 2021.

An n-type contact layer (an n⁺-layer of high carrier concentration) 203, an n-type cladding layer 204, and an n-type optical guide layer 205 may include virtually the same structure as the semiconductor layers in the semiconductor laser 100 of the first embodiment, or the n-type contact layer 103, the n-type cladding layer 104 and the n-type optical guide layer 105, respectively.

An active layer 206 having a multiple quantum well (MQW) structure may be formed on the n-type optical guide layer 205. The active layer 206 may be formed to comprise thirteen (13) layers by laminating approximately 5 nm in thickness of $Al_{0.95}In_{0.05}N$ quantum barrier layer 2061 and about 5 nm in thickness of $Al_{0.70}In_{0.30}N$ quantum well layer 2062 together alternately. In other words, the active layer 206 may include a multiple quantum well (MQW) structure comprising six (6) pairs of a quantum barrier layer 2061 and a quantum well layer 2062, or comprising 7 quantum barrier layers 2061 and 6 quantum well layers 2062.

A p-type optical guide layer 207, a p-type cladding layer 208, a p-type contact layer 209, a positive electrode 210A and a negative electrode 210B may be formed to have almost the same structure as the corresponding layers in the semiconductor laser 100 of the first embodiment, (i.e.,—the p-type optical guide layer 107, the p-type cladding layer 108, the p-type contact layer 109, the positive electrode 110A and the negative electrode 110B, respectively).

An exemplary process for manufacturing the semiconductor laser 200 will be explained hereinafter. Each layers in the semiconductor laser 200 may be formed through the use of a MOVPE method. The gases employed in this process may be the same as those employed in the first embodiment.

An exemplary process for manufacturing the buffer layer 202 will be explained hereinafter. The process for manufacturing the buffer layer 202 may begin by using an organic washing solvent and heat treatment to clean a single crystalline sapphire substrate 201 having thickness of 100 to 400 μm and placing the substrate 201 on a susceptor in a reaction chamber for the MOVPE treatment. Then the sapphire substrate may be etched by vapor phase etching at 1100° C. by $H_2$ vapor fed at a flow rate of 2 liter/min. into the chamber under normal pressure.

Approximately 500 Å in thickness of AlN may be formed on the sapphire substrate 201 as a first mismatching relaxation layer 2021 by lowering the temperature in the chamber to 400° C., and by concurrently supplying $H_2$, $NH_3$, and TMA at a flow rate of 20 liter/min, 10 liter/min, and $1.8 \times 10^{-5}$ mol/min, respectively. Approximately 0.3 μm in thickness of GaN may be formed on the first mismatching relaxation layer 2021 as a first single crystal layer 2022 by raising the temperature of the sapphire substrate 201 to 1150° C., and then maintaining the temperature constant, and concurrently supplying $H_2$, $NH_3$, and TMG at a flow rate of 20 liter/min, 10 liter/min, and $1.7 \times 10^4$ mol/min, respectively.

Approximately 500 Å in thickness of AlN may be formed on the first single crystal layer 2022 as a second mismatching relaxation layer 2021 by lowering the temperature of the sapphire substrate 201 to 400° C., and concurrently supplying the same gas employed to form the first mismatching relaxation layer 2021 at the same flow rate. Approximately 0.3 μm in thickness of GaN may be formed on the second mismatching relaxation layer 2021 as a second single crystal layer 2022 by raising the temperature of the sapphire substrate 201 to 1150° C., and concurrently supplying the same gas employed to form the first single crystal layer 2022 at the same flow rate. The temperature of the sapphire substrate 201 may be lowered to 400° C., and a third mismatching relaxation layer 2021 may be formed under the same conditions as employed in forming the first and the second mismatching relaxation layers 2021.

The buffer layer 202 shown in FIG. 4 may be obtained in the above described process.

After laminating the n-type optical guide layer 205, an exemplary process for manufacturing an active layer 206 may begin by forming approximately 5 nm in thickness of $Al_{0.40}In_{0.60}N$ thereon as a quantum barrier layer 2061 by concurrently supplying $N_2$ as a carrier gas, $NH_3$, TMA, and TMI. The crystal growth temperature is approximately 600° C. to 900° C., and the quantity of the gases, TMA, TMI and $NH_3$, supplied may be approximately 2–10 μmol/min and 15–100 μmol/min. and 11 slm, respectively.

Approximately 5 nm in thickness of $A_{0.70}In_{0.30}N$ may be formed on the quantum barrier layer 2061 as a quantum well layer 2062 by concurrently supplying $N_2$ as a carrier gas, $NH_3$, TMA, and TMI. The crystal growth temperature is approximately 600° C. to 900° C., and the quantity of gases, TMA, TMI and $NH_3$, supplied may be approximately 2–10 μmol/min and 15–100 μmol/min. and 11 slm, respectively.

Similarly, five pairs of a quantum barrier layer 2061 and a quantum well layer 2062 may be formed in sequence under the same respective conditions, and then about 5 nm in thickness of $Al_{0.95}In_{0.05}N$ as a quantum barrier layer 2061 may be formed thereon.

Accordingly, an active layer 206 shown in FIG. 4 may be produced.

Other semiconductor layers or electrodes in the semiconductor laser 200 may be formed using almost the same process as that employed in the first embodiment.

Thus the obtained semiconductor laser 200 exhibits a luminous output of 10 mW and an emission peak wavelength of 410 nm (bluish purple) at 1000 mA of driving current.

Because the semiconductor laser 200 comprises a quantum well layer 2062 having a high composition ratio of indium (In), a non-uniformity of InN composition hardly occurs in the quantum well layer. As a result, the process generates a semiconductor laser having an optimum structure.

By forming a quantum barrier layer 2061 and a quantum well layer 2062 having a high composition ratio of In, the active layer 206 possesses a larger lattice constant and a comparative softness in comparison to conventional devices. As a result, driving voltage (oscillation threshold) may be sufficiently controlled, and a semiconductor laser having an improved structure and an increased performance life may be manufactured by relaxing and/or lowering the thermal stress and the driving voltage.

Consequently, a light-emitting semiconductor device (LD), having an increased performance life and a lowered driving voltage (oscillation threshold), may be manufactured by the above-described method.

Generally, when the composition ratio x of indium (In) in a quantum well layer 2062 is comparatively larger than that of a conventional quantum well layer, composition ratio y of gallium (Ga) in a quantum barrier layer 2061 may be adjusted to satisfy y=0, y≈0 or $0 \leq y \leq 0.1$. As a result, the optimum or a suitable band gap condition, e.g., $0 \leq z \leq x \leq 1$, enables the lattice constant of the quantum barrier layer 2061 to adjust to the conditions of the quantum well layer 2062.

As in the semiconductor laser 200, crystallinity of the active layer 206 having a multiple quantum well structure may be improved. As a result, a semiconductor laser having a large luminous output, a decreased threshold current and a low driving voltage may be obtained.

By forming a quantum barrier layer 2061 to contain the mixing ratio as described above, both of its composition ratio z of indium (In) and the lattice constant may be enlarged. A quantum barrier layer 2061 having a comparatively softness may also be obtained. As a result, a stress relaxation effect, which is similar to the quantum well layer 2062, may be obtained by the quantum barrier layer 2061.

In the semiconductor laser 200, the active layer may be formed to include thirteen layers (N=6, M=7). By forming the active layer 206 to comprise an optimum number of layers, an active layer of high quality, high luminous intensity and low driving voltage, which may suppress adverse effects caused by the internal stress, may be obtained in a comparatively shorter time period.

By forming a buffer layer to include a multiple layer structure, the crystallinity of the semiconductor layers (203–209), which are formed thereon, may be improved. The benefits and results of the multiple layer structure are described below.

Because of this structure, the lattice defect which extends from the surface of a substrate in a vertical direction may be interrupted by the multiple mismatching relaxation layers 2021 and single crystal layers 2022 laminated together alternately. Thus, the lattice defect does not reach the aimed single crystal layer. Especially dislocation from the surface of the substrate may be interrupted and transmission of lattice defect to the upper layer may be prevented. As a result, the lattice defect concentration of the semiconductor layers decreases, and a single crystal semiconductor made of $Al_{x3}Ga_{y3}In_{1-x3-y3}N$ may be obtained on a substrate made of different materials.

Thus, when a semiconductor device comprises the single crystal semiconductor as a base layer, the crystallinity of the semiconductor layers in the device becomes better and the characteristics of the semiconductor device may be improved. Especially, when the semiconductor device is a light-emitting device, its luminous efficiency, performance life, and luminous brightness can be improved.

In the second embodiment, the mismatching relaxation layer 2021 may comprise AlN. Alternatively, the mismatching relaxation layer 2021 may be made of binary compounds such as GaN and InN, ternary compounds such as AlGaN, InGaN and AlInN, and quaternary compounds such as AlGaInN. In this case, the mismatching relaxation layer may be formed at a low temperature in which a single crystal does not grow, and its thickness is preferably in a range of 100 Å to 1000 Å.

A single crystal layer formed on a mismatching relaxation layer may be made of the same material with the same or different composition ratio used to form the mismatching relaxation layer or a different material from that of the mismatching relaxation layer. In this embodiment, the single crystal layer may be made of GaN. Alternatively, the single crystal layer may be made of a ternary compound such as AlGaN, InGaN and ALInN, a quaternary compound such as AlGaInN having an arbitrary composition ratio. A growth temperature of the single crystal layer is in a region where a single crystal grows. Generally, a thickness of the single crystal layer is preferably in a range of approximately 500 Å to 3000 Å. The number of layers of the mismatching relaxation layer and the single crystal layer may be arbitrary laminated together.

By adjusting the thickness of the mismatching relaxation layer in a range of approximately 100 Å to 1000 Å and the thickness of the single crystal layer in a range of approximately 500 Å to 3000 Å, or by adjusting the growth temperature of the mismatching relaxation layer in a range of 350° C. to 800° C., the lattice defect which may extend from the surface of a conventional substrate in a vertical direction may be efficiently prevented from reaching the aimed layer (an active layer, an optical guide layer, a cladding layer, contact layer).

The preferred thickness of the single crystal layer 2022 should not exceed 3000 Å, because the warpage of the device increases.

A mismatching relaxation layer 2021 and a single crystal layer 2022 may be made of a quaternary, ternary, or binary nitride group compound semiconductor represented by a general formula $Al_xGa_yIn_{1-x-y}N$ and having an arbitrary composition ratio. By forming the mismatching relaxation layer and the single crystal layer using AlN and GaN, respectively, the lattice defect concentration decreases. Thus, a substrate 201 may be made of sapphire, SiC, etc.

After the formation of the uppermost mismatching relaxation layer 2021, an n-type contact layer 203 may be formed while raising the temperature. This process provides the optimum for crystallinity of the n-type contact layer 203 and is preferable for its easiness of production.

The buffer layer 202 include various structures that optimizes the thickness and the composition ratio of each layer of the buffer layer 202 and optimizes the number of laminating layers. Each layers formed in the buffer layer 202 may have a different thickness and composition ratio.

When the process includes an AlN mismatching relaxation layer of low growth temperature (about 400° C.), approximately 5 μm in thickness of a GaN layer (a single crystal layer), a GaN mismatching relaxation layer, approximately 5 μm in thickness of a GaN layer (a single crystal layer) laminated on the sapphire substrate, the surface density of the etch pit at the surface of the uppermost GaN layer may be approximately $5 \times 10^6/cm^2$. Accordingly, the etch pit number decreases considerably (decreases more than one digit number) compared with that of a conventional device.

In the second exemplary embodiment, the active layer 206 includes a multiple quantum well structure. Alternatively, the active layer 206 formed in a light-emitting semiconductor device such as an LED may include a single quantum well (SQW) structure where the thickness of the active layer is generally in the range of 100 Å to 1000 Å.

Figure 5:
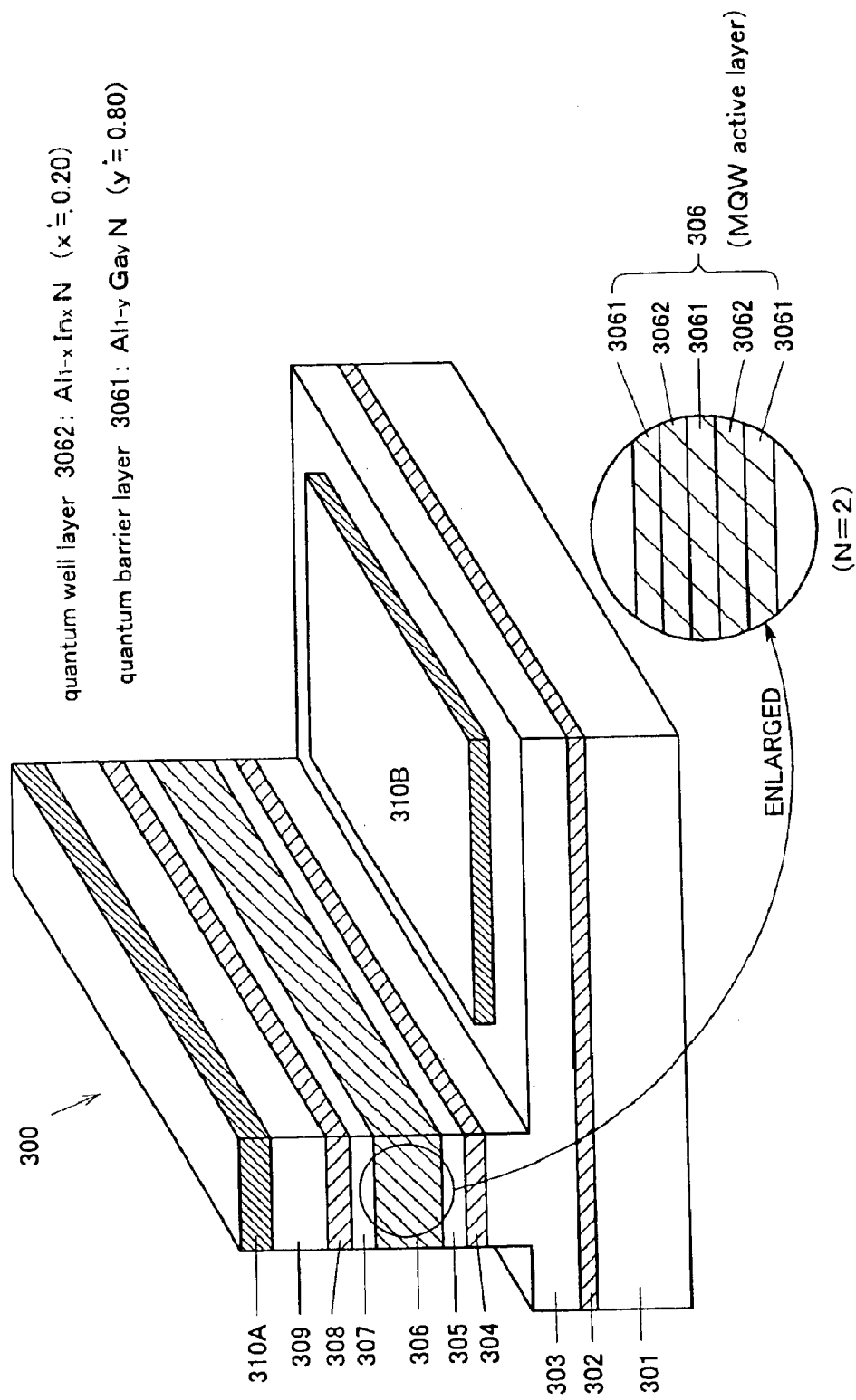
FIG. 5 is a view showing a group III nitride group compound semiconductor laser 300 according to a third embodiment of the present invention.

FIG. 5 illustrates the third embodiment as a group III nitride group compound semiconductor laser 300.

As shown in FIG. 5, the main characteristics of the semiconductor laser 300 may be as follows:

(1) A MQW active layer 306 (comprising five layers in total, two periods of MQW structure)
  (1) A quantum well layer 3062 ($Al_{1-x}In_xN$; x≈0.20, about 5 nm in thickness)
  (2) A quantum barrier layer 3061 ($Al_{1-y}Ga_yN$; y≈0.80, about 5 nm in thickness)

In comparison, the first embodiment may employ only one $Al_{0.15}Ga_{0.85}N$ buffer layer 102 as a buffer layer. However, in this third embodiment, a crystal growth in lateral direction of a buffer layer 302, which have no insulation layer and has two layer structure, may be used to laminate group III nitride group compound semiconductor layers in sequence in the semiconductor laser 300.

In short, a second characteristic of the semiconductor laser 300 may be used to form a buffer layer 302 as follows:
  (2) A buffer layer 302 (comprising two layers in total, having a rugged pattern by etching)
  (1) A mismatching relaxation layer 3021 (a lower layer; AlN, about 1000 Å in thickness)
  (2) A single crystal layer 3022 (an upper layer; GaN, about 1000 Å in thickness)

Figure 6:
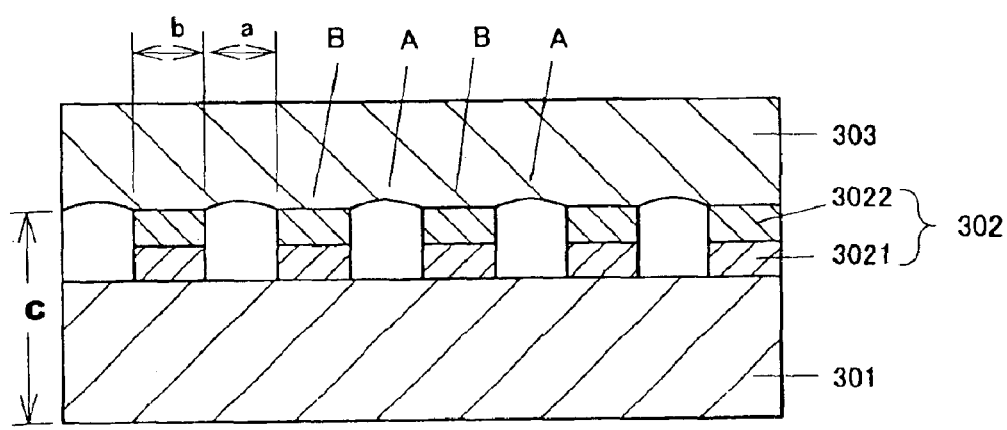
FIG. 6 is a schematic sectional view of the group III nitride group compound semiconductor 300 according to the third embodiment of the present invention.

FIG. 6 is a sectional view showing an exemplary structure of the buffer layer 302 which may be formed in the group III nitride group compound semiconductor laser 300 of this third embodiment. Approximately 1000 Å in thickness of AlN mismatching relaxation layer 3021 may be formed on a sapphire substrate 301. Approximately 1000 Å in thickness of GaN single crystal layer 3022 may be formed on the mismatching relaxation layer 3021.

The buffer layer 302 may comprise the mismatching relaxation layer 3021 and the single crystal layer 3022. The mismatching relaxation layer 3021 and the single crystal layer 3022 may be formed in either a striped or grid pattern. Approximately 10 μm in thickness of GaN layer may be formed on the single crystal layer 3022 and an exposed region A of the sapphire substrate 301 as an n-type contact layer (a n$^+$-layer of high carrier concentration) 303.

A method for manufacturing the group III nitride group compound semiconductor laser 300 in this embodiment may be similar to that of the semiconductor laser 100 of the first embodiment. In this third embodiment, the mismatching relaxation layer 3021 and the single crystal layer 3022 may be laminated in sequence uniformly on the sapphire substrate 301. The mismatching relaxation layer 3021 and the single crystal layer 3022 may be dry-etched while the SiO$_2$ layer having the predetermined pattern may be used as a mask, and then the mask (SiO$_2$ layer) may be removed. As a result, as shown in FIGS. 5B and 5C, the mismatching relaxation layer 3021 and the single crystal layer 3022 may be formed in either a striped or grid pattern.

A necessity for exposing a portion of the substrate 301, however, depends on the facets such as the thickness of the buffer layer 302, the partial or direction-dependent crystal growth velocity of a layer laminated on an exposed portion of the single crystal layer 3022, etc. The substrate 301 should not be exposed at the concave part of the buffer layer 302 (the lowest part) in this etching process. When the mismatching relaxation layer 3021 is thick, its lower part may remain at a degree in which the substrate 301 is not exposed.

A crystal growth velocity on a different material may exhibit a much lower crystal growth velocity than the crystal growth on the same material. Thus, when the depth of the concave part of the buffer layer 302 cannot be easily or sufficiently maintained, the substrate should be exposed. This step may be applied to the first embodiment of the present invention. Accordingly, a partial or direction-dependent crystal growth velocity of a layer laminated on an exposed portion of a substrate and a buffer layer (a mismatching relaxation layer), is significant to this growth in the lateral direction.

In the above described etching process, the substrate 301 may be exposed and the depth of the concave part of the buffer layer 302 may be adjusted to be sufficiently large, or approximately 2000 Å in thickness.

An n-type contact layer (n$^+$-layer of high carrier concentration) made of GaN, having a thickness approximately 10 μm, and other layers laminated thereon may be formed in almost the same process as that employed in the first embodiment.

The crystal growth process (action and effect) of the n-type contact layer 303 may be as described below.

As shown in FIG. 6, the GaN n-type contact layer 303 grows from GaN, or the upper region B of the single crystal layer 3022, which serves as a nucleus, in a direction vertical to the surface. A GaN layer grows epitaxially in a lateral direction on an exposed region A of the sapphire substrate 301 from GaN, which serves as a nucleus and formed on the exposed region B of the single crystal layer 3022.

In a process of growing the n-type contact layer 303, the n-type contact layer grows axially in both vertical and lateral directions from the single crystal layer 3022 which serves as a nucleus. As a result, an n-type contact layer 303 having higher crystallinity compared with that in the first embodiment may be obtained.

As described above, by further growing a group III nitride group compound semiconductor on a group III nitride group compound semiconductors such as an n-type contact layer, a light-emitting/light-receiving device, e.g., a light-emitting diode and a semiconductor laser (LED, LD), having an improved characteristics may be obtained.

The thus-obtained semiconductor laser 300 exhibits a luminous output of 10 mW and an emission peak wavelength of 380 nm (ultraviolet rays) at 1000 mA of driving current.

A light-emitting semiconductor device (LD) manufactured by the above-described method may have an increased performance life and a lowered driving voltage (oscillation threshold).

Alternatively, the substrate 301 may be made of silicon (Si). Another alternative is a semiconductor laser having an optimum structure, similar to that in the first embodiment, may be obtained even when the single crystal layer 3022 is not laminated.

In this embodiment, the single crystal layer 3022 and the n-type contact layer 303 may be made of GaN. Alternatively, the single crystal layer 3022 and the n-type contact layer 303 may be made of a group III nitride group compound semiconductor which satisfies the formula Al$_x$Ga$_y$In$_{1-x-y}$N ($0 \leq x \leq 1$, $0 \leq y \leq 1$, $0 \leq x+y \leq 1$) having almost the same composition ratio.

But when a portion of the substrate is exposed by etching, the single crystal layer 3022 preferably has a composition ratio which is comparatively difficult to grow epitaxially on the substrate 301. For example, when the substrate 301 is made of silicon (Si), the single crystal layer 3022 is preferably made of a group III nitride group compound semiconductor including no aluminum (Al).

Alternatively, the single crystal layer 3022 and the n-type contact layer 303 may have different composition ratios.

Generally, a partial or direction-dependent crystal growth velocity of a layer laminated on an exposed portion of a substrate or a buffer layer (a mismatching relaxation layer), is significant to this growth in lateral direction. The crystal growth velocity may be determined by factors such as each composition ratio of the exposed portions of the substrate and the buffer layer (the mismatching relaxation layer), the lattice constant, the crystallinity, crystal orientation, and the growth temperature. For example, the crystal growth velocity tends to increase when the composition ratio (mixing ratio) of each elements of the exposed surface is closer to a layer laminated on the exposed surface compared with when a layer laminated on the exposed surface which is a different semiconductor layer.

Accordingly, in this embodiment, it is preferable that the composition ratio of the single crystal layer 3022 is closer to that of the n-type contact layer 303. A depth of the concave part of the buffer layer 302 needs to be determined by considering, for example, a partial or direction-dependent crystal growth velocity as described in this embodiment.

In the first and the third embodiments, regions C, (FIGS. 3A & 6) which are from the sapphire substrate 301 and the silicon substrate to the single crystal layer 3022 and the buffer layer 102, may be removed by polishing or etching. As a result, a single crystal GaN substrate having no dislocations may be obtained.

In the first, second and third embodiments, an InGaN having an arbitrary composition ratio may be applied to each n-type contact layers.

In the first and third embodiments, a mismatching relaxation layer made of AlGaN or AlGaInN having an arbitrary composition ratio, as described in the second embodiment, may be formed between a substrate for crystal growth and a buffer layer. A layer having an amorphous structure or crystalline structure such as a microcrystal-containing amorphous structure which may be formed at a temperature lower than the single-crystal growth temperature of the n-type contact layer 303 and the single crystal layer 3022 may be applied to the mismatching relaxation layer.

Instead of AlN, the buffer layers 102, 202, and 302, or layers which consist of the buffer layers 102, 202, and 302, may be made of GaN, InN, $Al_xGa_{1-x}N$ (0<x<1), $In_xGa_{1-x}N$ (0<x<1), $Al_xIn_{1-x}N$ (0<x<1), and $Al_xGa_yIn_{1-x-y}N$ (0<x<1, 0<y<1, 0<x+y<1). The buffer layers 102, 202, and 302 may also be made of $Al_xGa_yIn_{1-x-y}N$ (0≦x≦1, 0≦y≦1, 0≦x+y≦1), in which group III elements may be partially substituted by boron (B) or thallium (Tl), and nitrogen atoms may be partially substituted by phosphorus (P), arsenic (As), antimony (Sb), or bismuth (Bi). As a result, strain generated in each buffer layers may be compensated and crystallinity of a semiconductor layer laminated thereon may be improved.

In the second embodiment, the buffer layer 202 of the semiconductor laser 200 is not formed in a rugged pattern (an island pattern) by etching as the buffer layers 102 and 302 of the semiconductor lasers 100 and 300 in the first and third embodiment. Alternatively, as in the first and third embodiments, etching may be carried out on the buffer layer 202 so that a crystallinity of a semiconductor layer laminated thereon (an n-type contact layer 203) may be improved by growing in lateral direction.

Figure 7:
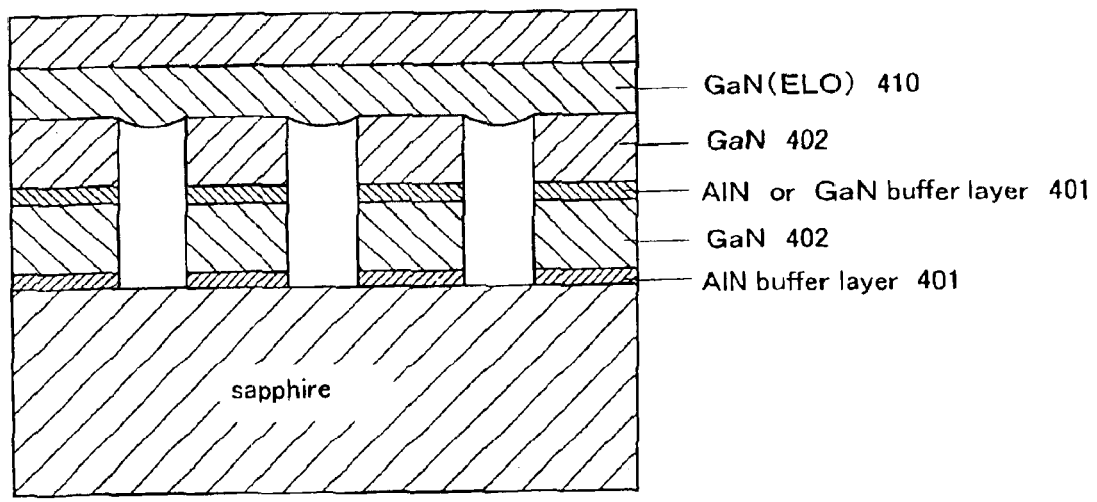
FIG. 7 is a schematic sectional view of a part of a group III nitride group compound semiconductor laser according to other embodiments of the present invention.
Figure 8:
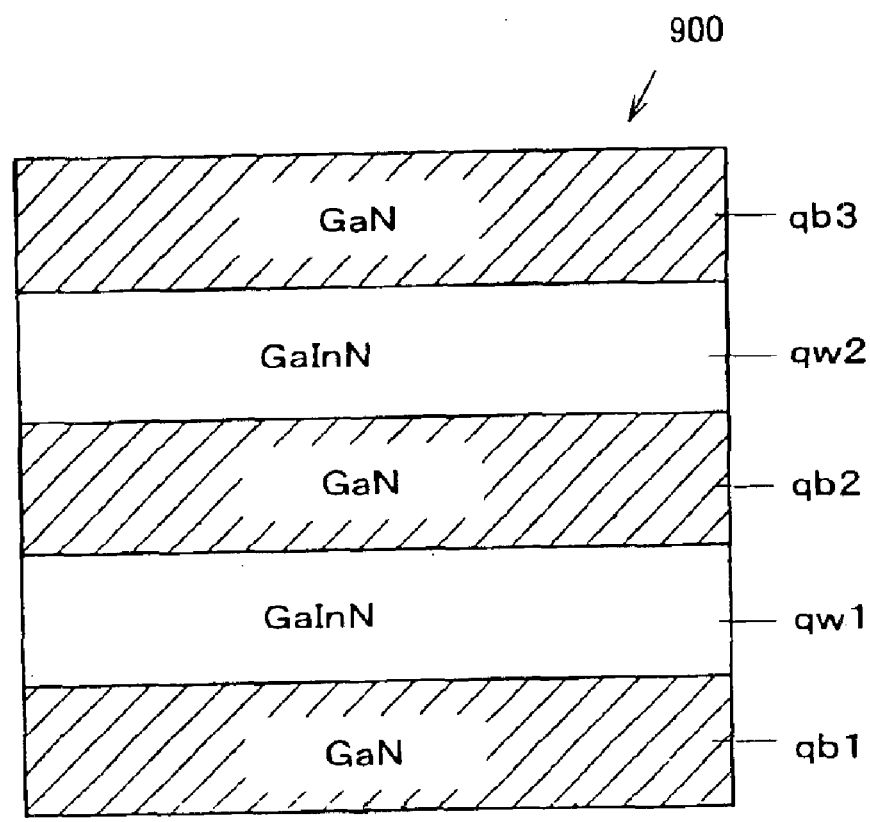
FIG. 8 is a schematic sectional view of a conventional multiple quantum well structure in a group III nitride group compound semiconductor layer according to the present invention.

Thus a buffer layer may be made of, for example, a binary, ternary, or quaternary group III nitride group compound semiconductor layer satisfying the formula $Al_{1-f-g}Ga_fIn_gN$ (0≦f≦1, 0≦g≦1, 0≦f+g≦1) and may have a structure as shown in FIG. 7. A crystal growth temperature of the buffer layer may be either low or high, and a number of laminating layers may be arbitrary.

For example, growing the layer laminated on the layer structure as shown in FIG. 7 in a lateral direction (an epitaxial lateral overgrowth, or ELO method) by using a semiconducting crystal as a nucleus is also an effective method.

By combining such methods effectively, a semiconductor layer having an improved crystallinity may be laminated.

For example, a doping process can be carried out on at least one of the GaN single crystal layer shown in FIG. 7, which grows by ELO method and GaN single crystal layers 401. Thus, the group III elements of at least one of the GaN single crystal layer 410, which grows by ELO method and GaN single crystal layers 402, may be partially substituted by boron (B) or thallium (Tl), and nitrogen atoms may be partially substituted by phosphorus (P), arsenic (As), antimony (Sb), or bismuth (Bi). As a result, the strain generated in the buffer layer may be compensated, and the crystallinity of a semiconductor layer laminated thereon may be improved.

A doping process, however, is not necessary when sufficient crystallinity of the semiconductor layer formed on the buffer layer may be obtained by optimizing the mixing ratio, the thickness, and the number of laminating layers in the buffer layer.

Alternatively, this method for improving crystallinity by ELO method (a method for manufacturing a semiconductor crystal) may be applied not only to the light-emitting semiconductor device in the present invention but also to a general device using group III nitride group compound semiconductor.

In a semiconductor crystal growth process (ELO) of the above embodiments, a layer preventing from crystal growth, e.g., a $SiO_2$ insulation film, is not used to grow a semiconductor crystal epitaxially in lateral direction. Alternatively, a semiconducting crystal can be grown epitaxially in a lateral direction by applying the following two methods.

Here "preventing from crystal growth" represents that a group III nitride group compound semiconductor which is difficult to grow or does not grow on a surface of a certain material. Also, "lateral direction" is a direction which is parallel to a crystal growth surface of the substrate.

A first method for growing a semiconductor crystal epitaxially in lateral direction is to form a first layer and a second layer on a substrate such as a silicon (Si) substrate or a sapphire substrate on base layers which comprises materials such as a binary, ternary, or quaternary group III nitride group compound semiconductor satisfying the formula $Al_{1-f-g}Ga_fIn_gN$ (0≦f<1, 0≦g≦1, 0≦f+g≦1) may be formed. The first layer "preventing from crystal growth" may be formed into an island pattern such that the exposed portions of the substrate or the base layer formed on the substrate may be formed in a scattered manner. The second layer made of a group III nitride group compound semiconductor grows epitaxially on the exposed portions of the silicon substrate which serves as a nucleus and grows epitaxially in lateral direction on the upper surface of the first layer.

According to the first method, the second layer made of a group III nitride group compound semiconductor does not grow epitaxially on the first layer. The second layer is a layer which grows from the exposed portions of the substrate or the base layer laminated on the substrate and grows epitaxially in lateral direction on the first layer. Then dislocations due to misfits between the substrate and the group III nitride group compound semiconductor grow in the vertical direction, but not in the lateral direction.

As a result, crystallinity of the group III nitride group compound semiconductor on the first layer may be improved. In addition, since there are no chemical junctions between the first layer and the group III nitride group compound semiconductor thereabove, the second layer causes neither warpage nor distortions which would otherwise be generated by stress in the layer.

A second method for growing a semiconducting crystal epitaxially in lateral direction is to laminate a third layer, a first layer, and a second layer in this sequence on a silicon (Si) substrate. The third layer may be made of a group III nitride group compound semiconductor. The first layer "preventing from crystal growth" may be formed into an island pattern such that the third layer exposed portions may be formed in a scattered manner. The second layer, which may comprise a group III nitride group compound semiconductor, grows epitaxially in a lateral direction on the upper surface of the first layer.

According to the second method, as in the first method, the second layer made of a group III nitride group compound semiconductor may be formed on the third layer made of a group III nitride group compound semiconductor which serves as a nucleus. In this method, not silicon but the same semiconductor material as that of the second layer may be used as a nucleus of crystal growth. That results in improving crystallinity of the second layer.

By using also these two methods, a semiconducting crystal can grow epitaxially in a lateral direction.

In the exemplary embodiments, a light-emitting device is manufactured by metal organic chemical vapor deposition (MOCVD). Alternatively, a semiconductor layer may be formed by using techniques such as molecular beam epitaxy (MBE), Halide vapor phase epitaxy (Halide VPE), liquid phase epitaxy (LPE), or any other appropriate manufacturing method as understood by those skilled in the art.

In the above embodiments, a laser diode which includes a multiple quantum well (MQW) structure emission layer is disclosed as an example. Alternatively, the light-emitting device may have a homo structure, a hetero structure, or a doublehetero structure. These structures may be formed through the formation of, for example, a pin junction or a pn junction. Also, the emission layer may have a single quantum well (SQW) structure.

In the above embodiments, sapphire and silicon may be used as a substrate for crystal growth. Alternatively, material such as SiC, $MgAl_2O_4$, ZnO, MnO, MgO, GaP, GaS, $LiGaO_2$, MoS, GaN, and other group III nitride group compound semiconductors may also be employed as a substrate for crystal growth.

In order to grow the group III nitride group compound semiconductor having excellent crystallinity, a buffer layer (or a mismatching relaxation layer) may be formed on the substrate for compensating the lattice mismatch between the substrate and the group III nitride group compound semiconductor. Even when the substrate is made of other materials, a buffer layer (or a mismatching relaxation layer) is preferably formed on the substrate. The buffer layer or the mismatching relaxation layer may be made of a group III nitride group compound semiconductor satisfying the formula $Al_xGa_yIn_{1-x-y}N$ ($0 \leq x \leq 1$, $0 \leq y \leq 1$, $0 \leq x+y \leq 1$), which may be formed at a low temperature. Preferably, the buffer layer or the mismatching relaxation layer is made of $Al_xGa_{1-x}N$ ($0 \leq x \leq 1$).

The group III nitride group compound semiconductor may also be made of group III nitride group compound in which a part of the group III element may be changed to boron (B) or thallium (Tl), and a part of nitrogen (N) is changed to phosphorus (P), arsenic (As), antimony (Sb), bismuth (Bi), and so on.

The above-discussed embodiment employs an irradiating electron rays to produce a lower conductive p-type. Alternatively, heat treatment in an atmosphere of nitrogen ($N_2$) plasma gas, or laser irradiation may be used.

In the above embodiment, a method for manufacturing a laser diode is explained. Alternatively, the method may be applied to various GaN electronic devices such as a light-emitting diode, a light-receiving device 1 HEMT, transistor.

This invention discloses a useful method for manufacturing a group III nitride group compound semiconductor. The invention especially discloses, a process for manufacturing the base layers, i.e., an n-contact layer (103, 203, 303) made of materials such as gallium nitride (GaN), on which a light-emitting semiconductor device may be formed. This is sufficiently effective process to improve the crystallinity of each of the semiconductor layers, which forms the general structure of a semiconductor device.

Accordingly, a method for laminating layers (a mismatching relaxation layer and a single crystal layer) in a buffer layer, a process of growing a semiconducting crystal in lateral direction, etc. may be applied not only to the light-emitting semiconductor device of the present invention but also to a general light-emitting device using group III nitride group compound semiconductor. Thus, a lamination structure may not be limited to that of the light-emitting semiconductor device in the present invention.

In the exemplary embodiments of the invention, a group III nitride group compound semiconductor layer which may be obtained by lateral growth, e.g., a layer made of GaN, functions as a base layer and other layers may be laminated thereon. Also, a group III nitride group compound semiconductor layer which may be laminated on the group III nitride group compound semiconductor layer obtained by lateral growth, e.g., a layer made of GaN, functions as a base layer, and other layers may be laminated thereon.

Thus this invention also discloses a growth process to produce a base layer by lateral growth. The growth process, which produces a base layer, should be recognized as a process independent of the process to manufacture the device.

This invention discloses a method for forming a base layer. Consequently, a method for forming a group III nitride group compound semiconductor whose lattice defect may be decreased by lateral growth, a method for forming a base layer made of a group III nitride group compound semiconductor, and a method for forming a group III nitride group compound semiconductor substrate to a base layer may be obtained.

Also, by forming the base layer thicker, or by forming a group III nitride group compound semiconductor on the base layer thicker, a group III nitride group compound semiconductor substrate may be obtained after removing the substrate, the layers from the buffer layer to layers formed beneath the base layer.

In order to form a group III nitride group compound semiconductor thicker, Halide vapor phase epitaxy (Halide VPE) and liquid phase epitaxy (LPE) may be useful.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A light-emitting semiconductor device comprising:
    a substrate;
    plural semiconductor layers which are made of group III nitride group compound semiconductor formed on said substrate; and
    an active layer comprising a multiple quantum well structure comprising:
        a plurality of quantum well layers which satisfy the formula $Al_{1-x}In_xN$, where a composition ratio x of indium (In) is in a range of where 0.15<x<0.6; and
        at least one quantum barrier layer which satisfies the formula $Al_{1-x-y}Ga_yIn_zN$ ($0 \leq y \leq 1$, $0 \leq z<1$, $0 \leq z+y \leq 1$), alternately formed with said plurality of quantum well layers,
    wherein a composition ratio y of gallium (Ga) in said at least one quantum barrier layer is one of y=1, y≈1, and 0.9<y≦1, and
    wherein a thickness of said plurality of quantum well layers is in a range from 1 nm to 10 nm.

2. A light-emitting semiconductor device using a group III nitride group compound semiconductor according to claim 1, wherein said plurality of quantum well layers and said at least one quantum barrier layer are laminated together.

3. A light-emitting semiconductor device using a group III nitride group compound semiconductor according to claim 1, wherein said composition ratio y of gallium (Ga) in said at least one quantum barrier layer is y=1.

4. A light-emitting semiconductor device using a group III nitride group compound semiconductor according to claim 2, wherein said composition ratio z of indium (In) in said at least one quantum barrier layer is one of z=0, z≈0, and 0≦y<0.1.

5. A light-emitting semiconductor device using a group III nitride group compound semiconductor according to claim 1, wherein said composition ratio z of indium (In) in said at least one quantum barrier layer is one of z=0, z≈0, and 0≦z<0.1

6. A light-emitting semiconductor device using a group III nitride group compound semiconductor according to claim 1, wherein said plurality of quantum well layers comprises three to ten layers.

7. A light-emitting semiconductor device using a group III nitride group compound semiconductor according to claim 1, wherein a thickness of said at least one quantum barrier layer is in a range from 3 nm to 10 nm.

8. A light-emitting semiconductor device using a group III nitride group compound semiconductor according to claim 1, wherein some parts of nitrogen (N) in said plurality of quantum well layers are substituted for group V dopants by doping group V impurities such as phosphor (P), arsenic (As), antimony (Sb), and bismuth (Bi).

9. A light-emitting device using a group III nitride group compound semiconductor according to claim 1, wherein some parts of nitrogen (N) in at least one of said plurality of quantum well layers and said at least one quantum barrier layer are substituted for group V dopants by doping group V impurities such as phosphor (P), arsenic (As), antimony (Sb), and bismuth (Bi).

10. A light-emitting semiconductor device using a group III nitride group compound semiconductor according to claim 1, wherein some parts of group III elements (Al, Ga, and In) in said plurality of quantum well layers are substituted for other group III dopants by doping group III impurities such as boron (B) and thallium (Tl).

11. A light-emitting semiconductor device using a group III nitride group compound semiconductor according to claim 1, wherein some parts of group III elements (Al, Ga, and In) in at least one of said plurality of quantum well layers and said at least one quantum barrier layer are substituted for other group III dopants by doping group III impurities such as boron (B) an thallium (Tl).

12. A light-emitting semiconductor device using a group III nitride group compound semiconductor according to claim 9, wherein some parts of group III elements (Al, Ga, and In) in at least one of said plurality of quantum well layers and said at least one quantum barrier layer are substituted for other group III dopants by doping group III impurities such as boron (B) and thallium (Tl).

13. A light-emitting semiconductor device using a group III nitride group compound semiconductor according to claim 1, wherein said composition ratio x of indium (In) in said plurality of quantum well layers is $0.15<x<0.5$.

14. A light-emitting semiconductor device using a group III nitride group compound semiconductor according to claim 2, wherein said composition ratio x of indium (In) in said plurality of quantum well layers is $0.15 \leq x \leq 0.5$.

15. A light-emitting semiconductor device using a group III nitride group compound semiconductor according to claim 3, wherein said composition ratio x of indium (In) in said plurality of quantum well layer is $0.15<x<0.5$.

16. A light-emitting semiconductor device using a group III nitride group compound semiconductor according to claim 4, wherein said composition ratio x of indium (In) in said plurality of quantum well layers is $0.15<x<0.5$.

17. A light-emitting semiconductor device using a group III nitride group compound semiconductor according to claim 5, wherein said composition ratio x of indium (In) in said plurality of quantum well layers is $0.15<x<0.5$.

18. A light-emitting semiconductor device using a group III nitride group compound semiconductor according to claim 4, wherein said composition ratio x of indium (In) in said plurality of quantum well layers is $0.15 \leq x \leq 0.5$.

19. A light-emitting semiconductor device using a group III nitride group compound semiconductor according to claim 1, wherein a thickness of said plurality of quantum well layers is in a range from 2 nm to 6 nm.

20. A light-emitting semiconductor device using a group III nitride group compound semiconductor according to claim 4, wherein a thickness of said plurality of quantum well layers is in a range from 2 nm to 6 nm.

21. A light-emitting semiconductor device comprising:
a substrate;
a plurality of semiconductor layers formed on said substrate, said layers comprising a group III nitride group compound semiconductor; and
an active layer comprising:
at least one quantum well layer comprising $Al_{1-x}In_xN$, where $0.15<x<0.6$; and
at least one quantum barrier layer which satisfies the formula $Al_{1-x-y}Ga_yIn_zN$ ($0 \leq y<1$, $0 \leq z<1$, $0 \leq z+y \leq 1$), alternately formed with said quantum well layer,
wherein a composition ratio y of gallium (Ga) in said quantum barrier layer is one of $y=1$, $y \approx 1$, and $0.9<y \leq 1$, and
wherein a thickness of said plurality of quantum well layers is in a range from 1 nm to 10 nm.

22. A light-emitting semiconductor device according to claim 21, wherein said at least one quantum barrier layer is adjacent to said at least one quantum well layer.

23. A light-emitting semiconductor device according to claim 22, wherein said at least one quantum well layer comprises a plurality of quantum well layers comprising $Al_{1-x}In_xN$, where $0.15<x<0.6$, and
wherein said at least one quantum barrier layer comprises a plurality of quantum barrier layers comprising $Al_{1-x-y}Ga_yIn_zN$ ($0 \leq y \leq 1$, $0 \leq z+y \leq 1$), and alternately formed with said plurality of quantum well layers.

24. A light-emitting semiconductor device according to claim 23, wherein said plurality of quantum well layers comprises two quantum well layers having a thickness of about 4 nm and comprising $Al_{0.80}In_{0.7}N$, and
wherein said plurality of quantum barrier layers comprises three quantum barrier layers having a thickness of about 6 nm and comprising GaN.

25. A group III nitride group compound semiconductor device comprising:
a substrate; and
a light-emitting layer formed on said substrate, said light-emitting layer comprising:
a plurality of quantum well layers comprising $Al_{1-x}In_xN$, where $0.15<x<0.6$; and
a plurality of quantum barrier layers comprising $Al_{1-x-y}Ga_yIn_zN$ ($0 \leq y \leq 1$, $0 \leq z \leq 1$, $0 \leq z+y \leq 1$), which are alternately formed with said plurality of quantum well layers
wherein a composition ratio y of gallium (Ga) in said plurality of quantum barrier layers is one of $y=1$, $y \approx 1$, and $0.9<y \leq 1$, and,
wherein a thickness of said plurality of quantum well layers is in a range from 1 nm to 10 nm.

26. An active layer for a group III nitride group compound semiconductor device, comprising:
a plurality of quantum well layers which satisfy the formula $Al_{1-x}In_xN$, where a composition ratio x of indium (In) is in a range of $0.15<x<0.6$; and
at least one quantum barrier layer which satisfies the formula $Al_{1-x-y}Ga_yIn_zN$ ($0 \leq y \leq 1$, $0 \leq z<1$, $0 \leq z+y \leq 1$), alternately formed with said plurality of quantum well layers, and
wherein a thickness of said plurality of quantum well layers is in a range from 1 nm to 10 nm.

* * * * *

UNITED STATES PATENT AND TRADEMARK OFFICE
CERTIFICATE OF CORRECTION

PATENT NO.       : 7,084,421 B2
APPLICATION NO.  : 09/725496
DATED            : November 30, 2000
INVENTOR(S)      : Masayoshi Koike et al.

It is certified that error appears in the above-identified patent and that said Letters Patent is hereby corrected as shown below:

1) In claim 1, line 41, replace "$Al_{1-x-y}Ga_yIn_gN$" with --$Al_{1-z-y}Ga_yIn_zN$--.

2) In claim 13, line 41, replace "$0.15<x<0.5$" with --$0.15\leq x\leq 0.5$--.

3) In claim 15, line 48, replace "$0.15<x<0.5$" with --$0.15\leq x\leq 0.5$--.

4) In claim 16, line 52, replace "$0.15<x<0.5$" with --$0.15\leq x\leq 0.5$--.

5) In claim 17, line 56, replace "$0.15<x<0.5$" with --$0.15\leq x\leq 0.5$--.

6) In claim 21, line 8, replace "$0.15<x<0.6$" with --$0.15\leq x\leq 0.6$--.

7) In claim 21, line 11, replace "$Al_{1-x-y}Ga_yIn_zN$" with --$Al_{1-z-y}Ga_yIn_zN$--.

8) In claim 21, line 11, replace "$0\leq y<1$" with --$0\leq y\leq 1$--.

9) In claim 23, line 26, replace "$0.15<x<0.6$" with --$0.15\leq x\leq 0.6$--.

10) In claim 23, line 28, replace "$Al_{1-x-y}$" with --$Al_{1-z-y}$--.

11) In claim 23, line 29, add --$0\leq z<1$-- between "$0\leq y\leq 1$" and "$0\leq z+y\leq 1$"

12) In claim 24, line 34, replace "$In_{0.7}$" with --$In_{0.2}$--.

13) In claim 25, line 44, replace "$0.15<x<0.6$" with --$0.15\leq x\leq 0.6$--.

14) In claim 25, line 45, replace "$Al_{1-x-y}$" with --$Al_{1-z-y}$--.

15) In claim 26, line 58, replace "$0.15<x<0.6$" with --$0.15\leq x\leq 0.6$--.

UNITED STATES PATENT AND TRADEMARK OFFICE
CERTIFICATE OF CORRECTION

| | | |
|---|---|---|
| PATENT NO. | : 7,084,421 B2 | Page 2 of 2 |
| APPLICATION NO. | : 09/725496 | |
| DATED | : November 30, 2000 | |
| INVENTOR(S) | : Masayoshi Koike et al. | |

It is certified that error appears in the above-identified patent and that said Letters Patent is hereby corrected as shown below:

16) In claim 26, line 61, replace "$Al_{1-x-y}$" with --$Al_{1-z-y}$--.

Signed and Sealed this

Sixth Day of February, 2007

JON W. DUDAS
*Director of the United States Patent and Trademark Office*

UNITED STATES PATENT AND TRADEMARK OFFICE
CERTIFICATE OF CORRECTION

PATENT NO. : 7,084,421 B2
APPLICATION NO. : 09/725496
DATED : August 1, 2006
INVENTOR(S) : Masayoshi Koike et al.

It is certified that error appears in the above-identified patent and that said Letters Patent is hereby corrected as shown below:

1) In claim 1, line 41, replace "$Al_{1-x-y}Ga_yIn_gN$" with --$Al_{1-z-y}Ga_yIn_zN$--.

2) In claim 13, line 41, replace "$0.15<x<0.5$" with --$0.15\leq x\leq 0.5$--.

3) In claim 15, line 48, replace "$0.15<x<0.5$" with --$0.15\leq x\leq 0.5$--.

4) In claim 16, line 52, replace "$0.15<x<0.5$" with --$0.15\leq x\leq 0.5$--.

5) In claim 17, line 56, replace "$0.15<x<0.5$" with --$0.15\leq x\leq 0.5$--.

6) In claim 21, line 8, replace "$0.15<x<0.6$" with --$0.15\leq x\leq 0.6$--.

7) In claim 21, line 11, replace "$Al_{1-x-y}Ga_yIn_zN$" with --$Al_{1-z-y}Ga_yIn_zN$--.

8) In claim 21, line 11, replace "$0\leq y<1$" with --$0\leq y\leq 1$--.

9) In claim 23, line 26, replace "$0.15<x<0.6$" with --$0.15\leq x\leq 0.6$--.

10) In claim 23, line 28, replace "$Al_{1-x-y}$" with --$Al_{1-z-y}$--.

11) In claim 23, line 29, add --$0\leq z<1$-- between "$0\leq y\leq 1$" and "$0\leq z+y\leq 1$"

12) In claim 24, line 34, replace "$In_{0.7}$" with --$In_{0.2}$--.

13) In claim 25, line 44, replace "$0.15<x<0.6$" with --$0.15\leq x\leq 0.6$--.

14) In claim 25, line 45, replace "$Al_{1-x-y}$" with --$Al_{1-z-y}$--.

15) In claim 26, line 58, replace "$0.15<x<0.6$" with --$0.15\leq x\leq 0.6$--.

UNITED STATES PATENT AND TRADEMARK OFFICE
CERTIFICATE OF CORRECTION

PATENT NO. : 7,084,421 B2
APPLICATION NO. : 09/725496
DATED : August 1, 2006
INVENTOR(S) : Masayoshi Koike et al.

It is certified that error appears in the above-identified patent and that said Letters Patent is hereby corrected as shown below:

16) In claim 26, line 61, replace "$Al_{1-x-y}$" with --$Al_{1-z-y}$--.

This certificate supersedes Certificate of Correction issued February 6, 2007.

Signed and Sealed this

Twenty-seventh Day of February, 2007

JON W. DUDAS
*Director of the United States Patent and Trademark Office*